US008236477B2

(12) United States Patent
Matsumiya et al.

(10) Patent No.: US 8,236,477 B2
(45) Date of Patent: Aug. 7, 2012

(54) POSITIVE RESIST COMPOSITION AND METHOD OF FORMING RESIST PATTERN

(75) Inventors: Tasuku Matsumiya, Kawasaki (JP); Daiju Shiono, Kawasaki (JP); Tomoyuki Hirano, Kawasaki (JP); Takahiro Dazai, Kawasaki (JP); Kotaro Endo, Kawasaki (JP)

(73) Assignee: Tokyo Ohka Kogyo Co., Ltd., Kanagawa-ken (JP)

(*) Notice: Subject to any disclaimer, the term of this patent is extended or adjusted under 35 U.S.C. 154(b) by 323 days.

(21) Appl. No.: 12/591,819

(22) Filed: Dec. 2, 2009

(65) Prior Publication Data

US 2010/0183981 A1 Jul. 22, 2010

(30) Foreign Application Priority Data

Dec. 4, 2008 (JP) ................................ P2008-309850
May 29, 2009 (JP) ................................ P2009-130554

(51) Int. Cl.
*G03F 7/039* (2006.01)
*G03F 7/20* (2006.01)
*G03F 7/30* (2006.01)

(52) U.S. Cl. ..................... 430/270.1; 430/311; 430/326; 430/910

(58) Field of Classification Search ........................ None
See application file for complete search history.

(56) References Cited

U.S. PATENT DOCUMENTS 4,458,001 A 7/1984 Taylor
5,945,517 A 8/1999 Nitta et al.
6,153,733 A 11/2000 Yukawa et al.
7,074,543 B2 7/2006 Iwai et al.
7,078,562 B2 7/2006 Furukawa et al.
7,323,287 B2 1/2008 Iwai et al.
2003/0031950 A1 2/2003 Uenishi et al.
2003/0203309 A1 10/2003 Nishimura et al.
2005/0130058 A1 6/2005 Rahman
2007/0149702 A1 6/2007 Ando et al.
2008/0248421 A1 10/2008 Fukuhara et al.
2009/0130597 A1 5/2009 Seshimo et al.
2009/0226842 A1 9/2009 Shimizu et al.
2009/0317745 A1 12/2009 Mimura et al.
2010/0062364 A1 3/2010 Dazai et al.
2010/0062369 A1* 3/2010 Dazai et al. ................ 430/285.1
2010/0086873 A1 4/2010 Seshimo et al.
2010/0136480 A1 6/2010 Motoike et al.
2010/0178609 A1 7/2010 Dazai et al.
2010/0196821 A1 8/2010 Dazai et al.
2010/0209848 A1 8/2010 Dazai et al.
2010/0233623 A1 9/2010 Kurosawa et al.
2010/0233624 A1 9/2010 Kakinoya et al.

(Continued)

FOREIGN PATENT DOCUMENTS

JP 9-208554 8/1997

(Continued)

OTHER PUBLICATIONS

Office Action issued Sep. 12, 2011 in related U.S. Appl. No. 12/461,687. Office Action issued Sep. 12, 2011 in related U.S. Appl. No. 12/461,688.
Korean Notice of Allowance dated Jul. 22, 2011 issued in KR application 10-2009-0034593.
Office Action dated May 23, 2011 issued in U.S. Appl. No. 12/425,706.
Notice of Allowance issued Jan. 25, 2012 in U.S. Appl. No. 12/461,687.
Notice of Allowance issued Jan. 25, 2012 in U.S. Appl. No. 12/461,688.

(Continued)

*Primary Examiner* — Sin J. Lee
(74) *Attorney, Agent, or Firm* — Wenderoth, Lind & Ponack, L.L.P.

(57) ABSTRACT

A positive resist composition including a base component (A) which exhibits increased solubility in an alkali developing solution under action of acid and an acid-generator component (B) which generates acid upon exposure, the base component (A) including a polymeric compound (A1) containing a structural unit (a0) represented by general formula (a0-1), a structural unit (a1) derived from an acrylate ester containing an acid dissociable, dissolution inhibiting group, and a structural unit (a3) derived from an acrylate ester containing a hydroxy group-containing aliphatic hydrocarbon group represented by general formula (a3-1), and the amount of the structural unit (a3) based on the combined total of all structural units constituting the polymeric compound (A1) being in the range of 1 to 30 mol %.

(a0-1)

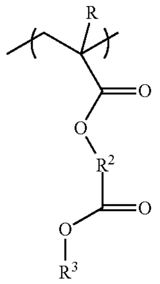

(a3-1)

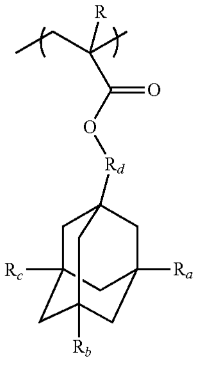

8 Claims, No Drawings

U.S. PATENT DOCUMENTS

| | | | |
|---|---|---|---|
| 2010/0233626 | A1 | 9/2010 | Shimizu et al. |
| 2010/0304289 | A1 | 12/2010 | Mimura et al. |
| 2010/0323296 | A1 | 12/2010 | Ichikawa et al. |

FOREIGN PATENT DOCUMENTS

| | | |
|---|---|---|
| JP | 11-35551 | 2/1999 |
| JP | 11-35552 | 2/1999 |
| JP | 11-35573 | 2/1999 |
| JP | 11-322707 | 11/1999 |
| JP | 2003-241385 | 8/2003 |
| JP | 2003-337419 | 11/2003 |
| JP | 2006-016379 | 1/2006 |
| JP | 2007-031355 | 2/2007 |
| JP | 2008-032840 | 2/2008 |
| JP | 2008-096743 | 4/2008 |
| JP | 2009-062414 | 3/2009 |
| JP | 2010-026478 | 2/2010 |
| KR | 2002-0077275 | 10/2002 |
| KR | 10-2007-0069068 | 7/2007 |
| WO | 2004/074242 | 9/2004 |

* cited by examiner

POSITIVE RESIST COMPOSITION AND METHOD OF FORMING RESIST PATTERN

TECHNICAL FIELD

The present invention relates to a positive resist composition and a method of forming a resist pattern using the resist composition.

Priority is claimed on Japanese Patent Application No. 2008-309850, filed Dec. 4, 2008, and Japanese Patent Application No. 2009-130554, filed May 29, 2009, the contents of which are incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as $F_2$ excimer lasers, electron beam, extreme ultraviolet radiation (EUV), and X-ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in an alkali developing solution under the action of acid and an acid generator that generates acid upon exposure.

For example, a chemically amplified positive resist contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are now widely used as base resins for resists that use ArF excimer laser lithography, as they exhibit excellent transparency in the vicinity of 193 nm (for example, see Patent Document 1). Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

Further, in order to improve various lithography properties, a base resin having a plurality of structural units is currently used for a chemically amplified resist. For example, in the case of a positive resist, a base resin containing a structural unit having an acid dissociable, dissolution inhibiting group that is dissociated by the action of acid generated from the acid generator, a structural unit having a polar group such as a hydroxyl group, a structural unit having a lactone structure, and the like is typically used. Among these structural units, a structural unit having a lactone structure is generally considered as being effective in improving the adhesion between the resist film and the substrate, and increasing the compatibility with an alkali developing solution, thereby contributing to improvement in various lithography properties.

DOCUMENTS OF RELATED ART

[Patent Document]

[Patent Document 1] Japanese Unexamined Patent Application, First Publication No. 2003-241385

[Patent Document 2] Japanese Unexamined Patent Application, First Publication No. 2006-016379

SUMMARY OF THE INVENTION

As further progress is expected to be made in lithography techniques and the application field for lithography techniques is expected to expand, development of a novel material for use in lithography will be desired. For example, as miniaturization of resist patterns progress, improvement will be demanded for resist materials with respect to various lithography properties such as resolution and the like.

Mask error factor (MEF) is one of such lithography properties. The MEF is a parameter that indicates how faithfully mask patterns of differing dimensions can be reproduced by using the same exposure dose with fixed pitch and changing the mask size (i.e., mask reproducibility). In the formation of a resist pattern using a conventional resist composition, when the mask size (e.g., the hole diameter of a hole pattern, or the line width of a line and space pattern) is changed, the amount of light irradiated on exposed portions is changed. As a result, disadvantages are likely to be caused in that the actual size of the formed pattern is deviated from the mask size, and pattern collapse occurs in the formation of an extremely fine pattern with a narrow pitch. For example, when a hole pattern having a hole diameter of about no more than 100 nm is formed, the circularity of the holes is likely to be deteriorated.

In view of the above situation, the present inventors made diligent studies. As a result, the present inventors have found that the above problems could be solved by using a polymeric compound containing the structural units (a0) and (a1) described later as a base component, and proposed a positive resist composition containing the polymeric compound (Japanese Patent Application No. 2008-247802). However, as a result of further diligent studies of the present inventors, it was found that, although the positive resist composition exhibited excellent lithography properties, the heat resistance was unsatisfactory. Therefore, the latitude of the bake temperature during resist pattern formation was small, and improvement in the heat resistance has been demanded in terms of process.

The present invention takes the above circumstances into consideration, with an object of providing a positive resist composition which exhibits excellent lithography properties and excellent heat resistance, and a method of forming a resist pattern using the positive resist composition.

As a result of further studies of the present inventors, it has been found that the heat resistance of the aforementioned polymeric compound can be improved by adding a structural unit containing a specific hydroxy group-containing aliphatic hydrocarbon group in a specific amount. The present invention has been completed based on this finding.

Specifically, a first aspect of the present invention is a positive resist composition including a base component (A) which exhibits increased solubility in an alkali developing solution under action of acid and an acid-generator component (B) which generates acid upon exposure, the base component (A) including a polymeric compound (A1) containing a structural unit (a0) represented by general formula (a0-1) shown below, a structural unit (a1) derived from an acrylate ester containing an acid dissociable, dissolution inhibiting group, and a structural unit (a3) derived from an acrylate ester containing a hydroxy group-containing aliphatic hydrocarbon group represented by general formula (a3-1) shown below, and the amount of the structural unit (a3) based on the combined total of all structural units constituting the polymeric compound (A1) being in the range of 1 to 30 mol %.

[Chemical Formula 1]

(a0-1)

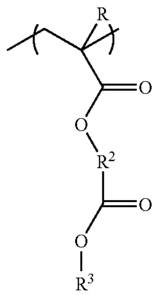

(a3-1)

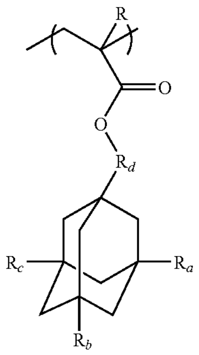

In formula (a0-1), R represents a hydrogen atom, an alkyl group of 1 to 5 carbon atoms or a halogenated alkyl group of 1 to 5 carbon atoms; $R^2$ represents a divalent linking group; and $R^3$ represents a cyclic group containing $—SO_2—$ group within the ring skeleton thereof. In formula (a3-1), R represents a hydrogen atom, an alkyl group of 1 to 5 carbon atoms or a halogenated alkyl group of 1 to 5 carbon atoms; each of Ra, Rb and Rc independently represents a hydrogen atom, an alkyl group of 1 to 5 carbon atoms, a hydroxy group or a hydroxyalkyl group, provided that at least one of Ra, Rb and Rc represents a hydroxy group or a hydroxyalkyl group; and Rd represents a single bond or a divalent linking group.

A second aspect of the present invention is a method of forming a resist pattern, including applying a positive resist composition according to the first aspect on a substrate to form a resist film, subjecting the resist film to exposure, and subjecting the resist film to alkali developing to form a resist pattern.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group.

A carbon atom on the α-position of an acrylate ester refers to the carbon atom bonded to the carbonyl group, unless specified otherwise.

The term "exposure" is used as a general concept that includes irradiation with any form of radiation.

According to the present invention, there are provided a positive resist composition which exhibits excellent lithography properties and excellent heat resistance, and a method of forming a resist pattern using the positive resist composition.

DETAILED DESCRIPTION OF THE INVENTION

<<Positive Resist Composition>22

The positive resist composition of the present invention (hereafter, frequently referred to simply as "resist composition") includes a base component (A) (hereafter, referred to as "component (A)") which exhibits increased solubility in an alkali developing solution under action of acid and an acid-generator component (B) (hereafter, referred to as "component (B)") which generates acid upon exposure.

In the positive resist composition, when radial rays are irradiated (when exposure is conducted), acid is generated from the component (B), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

Here, the term "base component" refers to an organic compound capable of forming a film. As the base component, an organic compound having a molecular weight of 500 or more can be preferably used. When the organic compound has a molecular weight of 500 or more, the film-forming ability is improved, and a resist pattern of nano level can be easily formed.

The "organic compound having a molecular weight of 500 or more" which can be used as a base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 2,000 or more is used. Hereafter, a polymer having a molecular weight of 2,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

<Component (A)>

[Polymeric Compound (A1)]

The polymeric compound (A1) (hereafter, referred to as "component (A1)") includes a structural unit (a0) represented by general formula (a0-1), a structural unit (a1) derived from an acrylate ester containing an acid dissociable, dissolution inhibiting group, and a structural unit (a3) derived from an acrylate ester containing a hydroxy group-containing aliphatic hydrocarbon group represented by general formula (a3-1).

The component (A1) preferably includes a structural unit (a2) derived from an acrylate ester containing a lactone-containing cyclic group, as well as the structural units (a0), (a1) and (a3).

(Structural Unit (a0))

In general formula (a0-1), R represents a hydrogen atom, an alkyl group of 1 to 5 carbon atoms or a halogenated alkyl group of 1 to 5 carbon atoms.

As the alkyl group for R, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group for R include groups in which part or all of the hydrogen atoms within the aforementioned alkyl groups has been substituted with a halogen atom. Examples of the halogen atom within the halogenated alkyl group include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (a0-1), $R^2$ represents a divalent linking group.

Preferable examples of $R^2$ include a divalent hydrocarbon group which may have a substituent, and a divalent linking group containing a hetero atom.

With respect to the "divalent hydrocarbon group which may have a substituent" for $R^2$, the hydrocarbon group "has a substituent" means that part or all of the hydrogen atoms within the hydrocarbon group has been substituted with a group or an atom other than a hydrogen atom.

The hydrocarbon group may be either an aliphatic hydrocarbon group or an aromatic hydrocarbon group. An "aliphatic hydrocarbon group" refers to a hydrocarbon group that has no aromaticity.

The aliphatic hydrocarbon group may be saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [$-CH_2-$], an ethylene group [$-(CH_2)_2-$], a trimethylene group [$-(CH_2)_3-$], a tetramethylene group [$-(CH_2)_4-$] and a pentamethylene group [$-(CH_2)_5-$].

As the branched aliphatic hydrocarbon group, branched alkylene groups are preferred, and specific examples include various alkylalkylene groups, including alkylmethylene groups such as $-CH(CH_3)-$, $-CH(CH_2CH_3)-$, $-C(CH_3)_2-$, $-C(CH_3)(CH_2CH_3)-$, $-C(CH_3)(CH_2CH_2CH_3)-$, and $-C(CH_2CH_3)_2-$; alkylethylene groups such as $-CH(CH_3)CH_2-$, $-CH(CH_3)CH(CH_3)-$, $-C(CH_3)_2CH_2-$, $-CH(CH_2CH_3)CH_2-$, and $-C(CH_2CH_3)_2-CH_2-$; alkyltrimethylene groups such as $-CH(CH_3)CH_2CH_2-$, and $-CH_2CH(CH_3)CH_2-$; and alkyltetramethylene groups such as $-CH(CH_3)CH_2CH_2CH_2-$, and $-CH_2CH(CH_3)CH_2CH_2-$. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of substituents include a fluorine atom, a fluorinated alkyl group of 1 to 5 carbon atoms, and an oxygen atom (=O).

As examples of the hydrocarbon group containing a ring in the structure thereof, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

With respect to the "divalent linking group containing a hetero atom" for $R^2$, a hetero atom within the "divalent linking group containing a hetero atom" refers to an atom other than carbon and hydrogen, and examples thereof include an oxygen atom, a nitrogen atom, a sulfur atom and a halogen atom.

Specific examples of the divalent linking group containing a hetero atom include plar groups such as —O—, —C(═O)—, —C(═O)—O—, a carbonate bond (—O—C(═O)—O—), —S—, —S(═O)$_2$—, —S(═O)$_2$—O—, —NH—, —NR$^{04}$— ($R^{04}$ represents a substituent such as an alkyl group or an acyl group), —NH—C(═O)— and ═N—. Further, a combination of at least one of these polar groups with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

$R^2$ may or may not have an acid dissociable portion in the structure thereof.

An "acid dissociable portion" refers to a portion within the organic group which is dissociated from the organic group by action of acid generated upon exposure. When the $R^2$ group has an acid dissociable portion, it preferably has an acid dissociable portion having a tertiary carbon atom.

In the present invention, as the divalent linking group for $R^2$, an alkylene group, a divalent aliphatic cyclic group or a divalent linking group containing a hetero atom is preferable. Among these, an alkylene group or a divalent linking group containing a hetero atom is particularly desirable.

When $R^2$ represents an alkylene group, it preferably has 1 to 10 carbon atoms, more preferably 1 to 6, still more preferably 1 to 4, and most preferably 1 to 3. Specific examples of alkylene groups include the aforementioned linear alkylene groups and branched alkylene groups.

When $R^2$ represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two hydrogen atoms have been removed from cyclopentane, cyclohexane, norbornane, isobornane, adamantane, tricyclodecane or tetracyclododecane is particularly desirable.

When $R^2$ represents a divalent linking group containing a hetero atom, preferable examples of the divalent linking group containing a hetero atom include —O—, —C(═O)—O—, —C(═O)—, —O—C(═O)—O—, —NH—C(═O)—, —NH—, —NR$^{04}$— ($R^{04}$ represents a substituent such as an alkyl group or an acyl group), —S—, —S(═O)$_2$—, —S(═O)$_2$—O—, a group represented by the formula -A-O-B-, and a group represented by the formula -[A-C(═O)—O]$_d$-B-. Herein, each of A and B independently represents a divalent hydrocarbon group which may have a substituent, and d represents an integer of 0 to 3.

When $R^2$ represents —NR$^{04}$—, $R^{04}$ represents a substituent such as an alkyl group or an acyl group. The substituent (an alkyl group, an acyl group or the like) preferably has 1 to 10 carbon atoms, more preferably 1 to 8, and most preferably 1 to 5.

In the group represented by the formula -A-O-B- or -[A-C(═O)—O]$_d$-B-, each of A and B independently represents a divalent hydrocarbon group which may have a substituent.

Examples of divalent hydrocarbon groups for A and B which may have a substituent include the same groups as those described above for the "divalent hydrocarbon group which may have a substituent" usable as $R^2$.

As A, a linear aliphatic hydrocarbon group is preferable, more preferably a linear alkylene group, still more preferably a linear alkylene group of 1 to 5 carbon atoms, and a methylene group or an ethylene group is particularly desirable.

As B, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula -[A-C(═O)—O]$_d$-B-, d represents an integer of 0 to 3, preferably an integer of 0 to 2, more preferably 0 or 1, and most preferably 1.

In general formula (a0-1), $R^3$ represents a cyclic group containing —SO$_2$— within the ring skeleton thereof. More specifically, $R^3$ is a cyclic group in which the sulfur atom (S) within the —SO$_2$— group forms part of the ring skeleton thereof.

The cyclic group for $R^3$ refers to a cyclic group including a ring that contains —SO$_2$— within the ring skeleton thereof, and this ring is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The cyclic group for $R^3$ may be either a monocyclic group or a polycyclic group.

As $R^3$, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

The cyclic group for $R^3$ preferably has 3 to 30 carbon atoms, more preferably 4 to 20, still more preferably 4 to 15, and most preferably 4 to 12.

Herein, the number of carbon atoms refers to the number of carbon atoms constituting the ring skeleton, excluding the number of carbon atoms within a substituent.

The cyclic group for $R^3$ may be either an aliphatic cyclic group or an aromatic cyclic group.

An aliphatic cyclic group is preferable.

Examples of aliphatic cyclic groups for $R^3$ include the aforementioned cyclic aliphatic hydrocarbon groups in which part of the carbon atoms constituting the ring skeleton thereof has been substituted with $—SO_2—$ or $—O—SO_2—$.

More specifically, examples of monocyclic groups include a monocycloalkane in which one hydrogen atom have been removed therefrom and a $—CH_2—$ group constituting the ring skeleton thereof has been substituted with $—SO_2—$; and a monocycloalkane in which one hydrogen atom have been removed therefrom and a $—CH_2—CH_2—$ group constituting the ring skeleton thereof has been substituted with $—O—SO_2—$. Examples of polycyclic groups include a polycycloalkane (a bicycloalkane, a tricycloalkane, a tetracycloalkane or the like) in which one hydrogen atom have been removed therefrom and a $—CH_2—$ group constituting the ring skeleton thereof has been substituted with $—SO_2—$; and a polycycloalkane in which one hydrogen atom have been removed therefrom and a $—CH_2—CH_2—$ group constituting the ring skeleton thereof has been substituted with $—O—SO_2—$.

The cyclic group for $R^3$ may have a substituent. Examples of the substituent include an alkyl group, an alkoxy group, a halogen atom, a halogenated alkyl group, a hydroxy group, an oxygen atom (=O), —COOR", —OC(=O)R", a hydroxyalkyl group and a cyano group. R" represents a hydrogen atom or an alkyl group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the —COOR" group and the —OC(=O)R" group, R" preferably represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxy group.

More specific examples of $R^3$ include groups represented by general formulas (3-1) to (3-4) shown below.

[Chemical Formula 2]

(3-1)

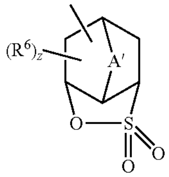

(3-2)

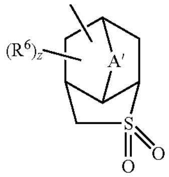

(3-3)

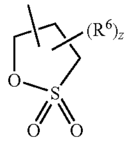

(3-4)

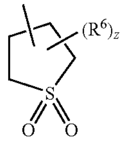

In the formulas, A' represents an oxygen atom, a sulfur atom, or an alkylene group of 1 to 5 carbon atoms which may contain an oxygen atom or a sulfur atom; z represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

Examples of alkylene groups that contain an oxygen atom or a sulfur atom include the aforementioned alkylene groups in which —O— or —S— is bonded to the terminal of the alkylene group or interposed within the alkyl group. Specific examples of such alkylene groups include $—O—CH_2—$, $—CH_2—O—CH_2—$, $—S—CH_2—$, $—CH_2—S—CH_2—$.

As A', an alkylene group of 1 to 5 carbon atoms, —O— or —S— is preferable. As the alkylene group of 1 to 5 carbon atoms, a methylene group is particularly desirable.

z represents an integer of 0 to 2, and is most preferably 0.

When z is 2, the plurality of $R^2$ may be the same or different from each other.

As the alkyl group, alkoxy group, halogenated alkyl group, —COOR", —OC(=O)R" and hydroxyalkyl group for $R^6$, the same alkyl groups, alkoxy groups, halogenated alkyl groups, —COOR", —OC(=O)R" and hydroxyalkyl groups as those described above as the substituent which the cyclic group for $R^3$ may have can be used.

Specific examples of the cyclic groups represented by general formulas (3-1) to (3-4) are shown below. In the formulas shown below, "Ac" represents an acetyl group.

[Chemical Formula 3]

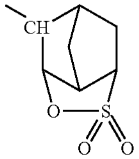
(3-1-1)

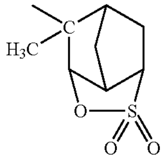
(3-1-2)

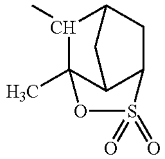
(3-1-3)

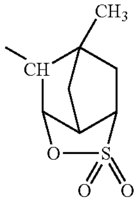
(3-1-4)

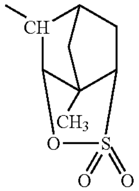
(3-1-5)

-continued

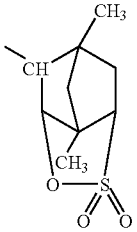
(3-1-6)

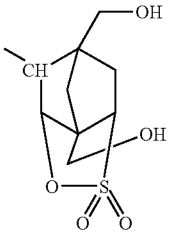
(3-1-7)

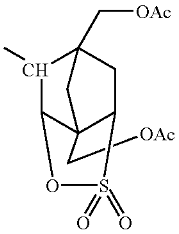
(3-1-8)

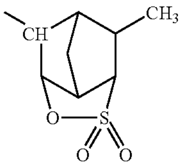
(3-1-9)

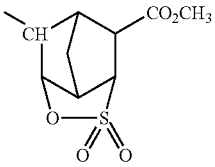
(3-1-10)

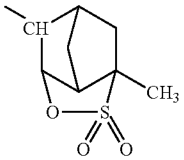
(3-1-11)

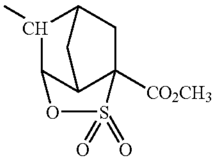
(3-1-12)

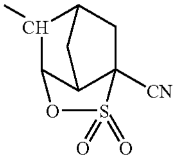
(3-1-13)

-continued
(3-1-14)
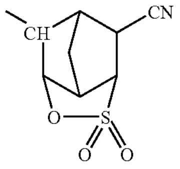
(3-1-15)
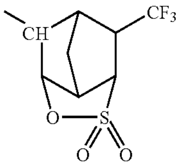
(3-1-16)
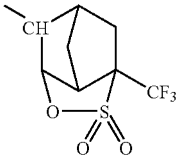
(3-1-17)
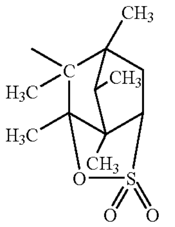
[Chemical Formula 4]
(3-1-18)
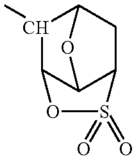
(3-1-19)
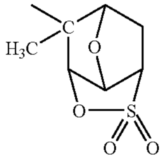
(3-1-20)
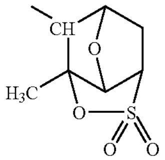
(3-1-21)
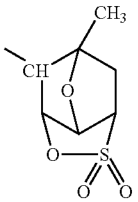
-continued
(3-1-22)
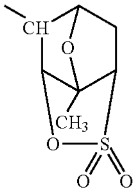
(3-1-23)
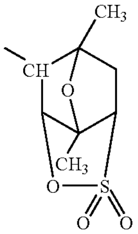
(3-1-24)
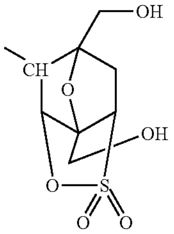
(3-1-25)
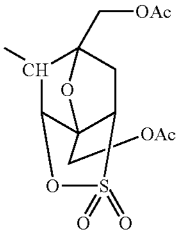
(3-1-26)
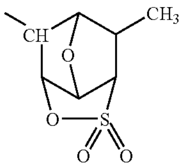
(3-1-27)
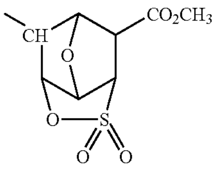
(3-1-28)
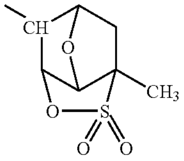
(3-1-29)
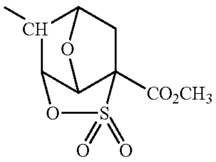

-continued (3-1-30)

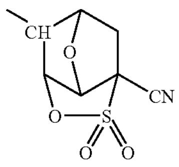

(3-1-31)

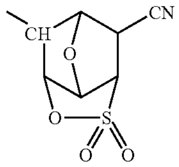

(3-1-32)

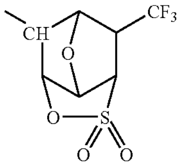

(3-1-33)

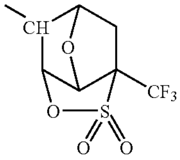

[Chemical Formula 5]

(3-2-1)

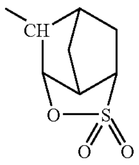

(3-2-2)

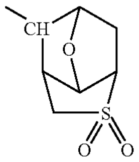

(3-3-1)

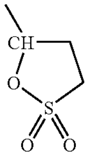

(3-4-1)

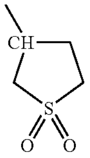

Among the examples shown above, as $R^3$, a group represented by general formula (3-1), (3-3) or (3-4) shown below is preferable, and a cyclic group represented by general formula (3-1) shown below is particularly desirable.

More specifically, as $R^3$, it is preferable to use at least one cyclic group selected from the group consisting of groups represented by chemical formulas (3-1-1), (3-1-18), (3-3-1) and (3-4-1) above, and a group represented by chemical formula (3-1-1) above is particularly desirable.

In the present invention, as the structural unit (a0), a structural unit represented by general formula (a0-1-11) shown below is particularly desirable.

[Chemical Formula 6]

(a0-1-11)

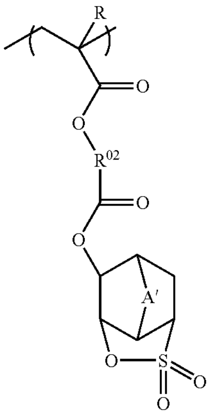

In the formula, R is the same as defined above; $R^{02}$ represents a linear or branched alkylene group or -A-C(═O)—O-B- (wherein A and B are the same as defined above); and A' is the same as defined above.

The linear or branched alkylene group for $R^{02}$ preferably has 1 to 10 carbon atoms, more preferably 1 to 8, still more preferably 1 to 5, still more preferably 1 to 3, and most preferably 1 or 2.

A and B in the formula -A-C(═O)—O-B- are respectively the same as defined for A and B in the formula -[A-C(═O)—O]$^d$-B- described above in the explanation of $R_2$.

A' is preferably a methylene group, an oxygen atom (—O—) or a sulfur atom (—S—).

As the structural unit (a0), one type of structural unit may be used alone, or two or more types of structural units may be used in combination.

In the component (A1), the amount of the structural unit (a0) based on the combined total of all structural units constituting the component (A1) is preferably 1 to 60 mol %, more preferably 5 to 50 mol %, still more preferably 10 to 40 mol %, and most preferably 15 to 40 mol %. When the amount of the structural unit (a0) is at least as large as the lower limit of the above-mentioned range, a resist pattern formed using the positive resist composition including the component (A1) exhibits excellent properties with respect to mask error factor (MEF), shape of the resist pattern (e.g., rectangularity of a line pattern, circularity of a hole pattern), in-plane uniformity (CDU), line width roughness (LWR), and the like.

Further, when the amount of the structural unit (a0) is no more than the upper limit of the above-mentioned range, excellent properties can be obtained with respect to heat resistance and resolution.

(Structural Unit (a1))

The structural unit (a1) is a structural unit derived from an acrylate ester containing an acid dissociable, dissolution inhibiting group.

The acid dissociable, dissolution inhibiting group within the structural unit (a1) has an alkali dissolution inhibiting effect that renders the entire component (A1) insoluble in an alkali developing solution prior to dissociation, and then following dissociation under action of acid generated from the component (B) upon exposure, increases the solubility of the entire component (A1) in the alkali developing solution.

As the acid dissociable, dissolution inhibiting group, any of those which have been proposed as acid dissociable, dissolution inhibiting groups for a base resin of a chemically amplified resist may be used. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable, dissolution inhibiting group, for example, a group represented by the formula —C($R^{71}$)($R^{72}$)($R^{73}$) can be given (in the formula, each of $R^{71}$ to $R^{73}$ independently represents a linear alkyl group of 1 to 5 carbon atoms). The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have part of the carbon atoms constituting the ring replaced with an ethereal oxygen atom (—O—).

Examples of aliphatic cyclic group-containing acid dissociable, dissolution inhibiting groups include (i) a group which has a tertiary carbon atom on the ring structure of a monovalent aliphatic cyclic group; and (ii) a group which has a branched alkylene group containing a tertiary carbon atom, and a monovalent aliphatic cyclic group to which the tertiary carbon atom is bonded.

Specific examples of (i) a group which has a tertiary carbon atom on the ring structure of a monovalent aliphatic cyclic group include groups represented by general formulas (1-1) to (1-9) shown below.

Specific examples of (ii) a group which has a branched alkylene group containing a tertiary carbon atom, and a monovalent aliphatic cyclic group to which the tertiary carbon atom is bonded include groups represented by general formulas (2-1) to (2-6) shown below.

[Chemical Formula 7]

(1-1)

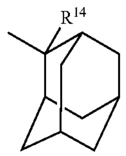

(1-2)

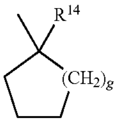

(1-3)

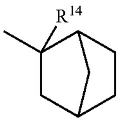

(1-4)

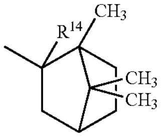

-continued (1-5)

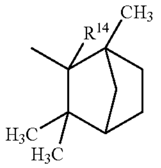

(1-6)

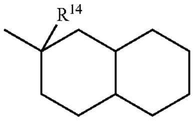

(1-7)

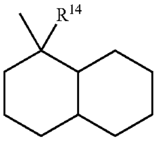

(1-8)

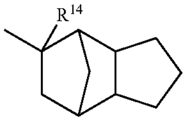

(1-9)

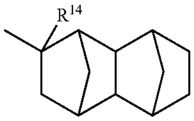

In the formulas above, $R^{14}$ represents an alkyl group; and g represents an integer of 0 to 8.

[Chemical Formula 8]

(2-1)

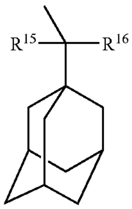

(2-2)

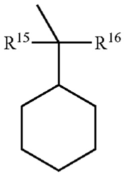

(2-3)

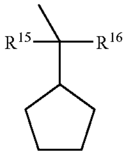

(2-4)

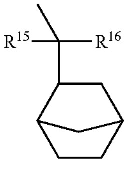

-continued (2-5)

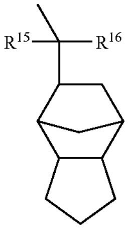

(2-6)

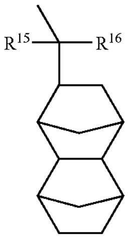

In the formulas above, each of $R^{15}$ and $R^{16}$ independently represents an alkyl group.

As the alkyl group for $R^{14}$, a linear or branched alkyl group is preferable.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably 1 to 3, and still more preferably 1 or 2.

As the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An “acetal-type acid dissociable, dissolution inhibiting group” generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 9]

(p1)

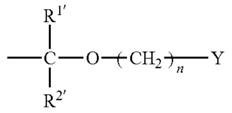

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1) above, n is preferably an integer of 0 to 2, more preferably 0 or 1, and most preferably 0.

As the alkyl group of 1 to 5 carbon atoms for $R^{h}$ and $R^{2'}$, the same alkyl groups of 1 to 5 carbon atoms as those described above for R can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 10]

(p1-1)

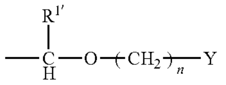

In the formula, $R^{1'}$, n and Y are the same as defined above.

As the alkyl group for Y, the same alkyl groups as those described above for R can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 11]

(p2)

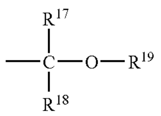

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Specific examples of acetal-type acid dissociable, dissolution inhibiting groups include groups represented by formulas (p3-1) to (p3-12) shown below.

[Chemical Formula 12]

(p3-1)

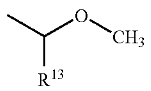

(p3-2)

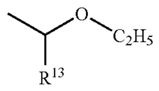

(p3-3)

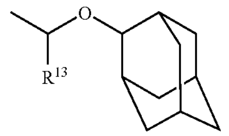

(p3-4)

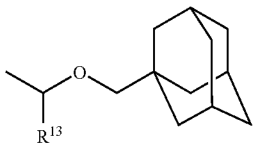

-continued (p3-5)

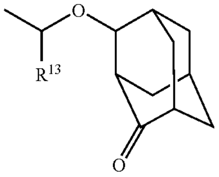

(p3-6)

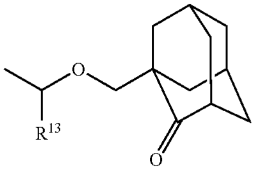

(p3-7)

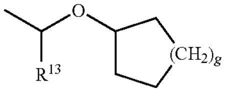

(p3-8)

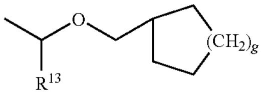

(p3-9)

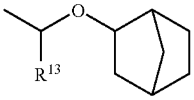

(p3-10)

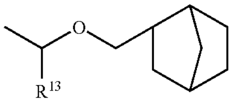

(p3-11)

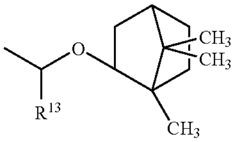

(p3-12)

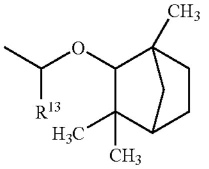

In the formulas above, $R^{13}$ represents a hydrogen atom or a methyl group; and g is the same as defined above.

Specific examples of the structural unit (a1) include a structural unit represented by general formula (a1-0-1) shown below and a structural unit represented by general formula (a1-0-2) shown below.

[Chemical Formula 13]

(a1-0-1)

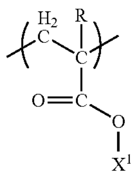

-continued (a1-0-2)

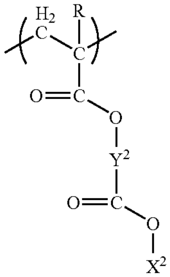

In the formulas, R represents a hydrogen atom, an alkyl group of 1 to 5 carbon atoms or a halogenated alkyl group of 1 to 5 carbon atoms; $X^1$ represents an acid dissociable, dissolution inhibiting group; $Y^2$ represents a divalent linking group; and $X^2$ represents an acid dissociable, dissolution inhibiting group.

In general formula (a1-0-1), R is the same as defined for R in general formula (a0-1).

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above.

$X^2$ is the same as defined for $X^1$ in general formula (a1-0-1).

As examples of the divalent linking group for $Y^2$, the same groups as those described above for $R^2$ in formula (a0-1) can be given.

As $Y^2$, the aforementioned alkylene group, a divalent aliphatic cyclic group or a divalent linking group containing a hetero atom is preferable. Among these, a divalent linking group containing a hetero atom is preferable, and a linear group containing an oxygen atom as a heteratom, e.g., a group containing an ester bond is particularly desirable.

More specifically, a group represented by the aforementioned formula -A-O-B- or -A-C(=O)—O-B- is preferable, and a group represented by the formula $—(CH_2)_x—C(=O)—O—(CH_2)_y—$ is particularly desirable.

x represents an integer of 1 to 5, preferably 1 or 2, and most preferably 1.

y represents an integer of 1 to 5, preferably 1 or 2, and most preferably 1.

Specific examples of the structural unit (a1) include structural units represented by general formulas (a1-1) to (a1-4) shown below.

[Chemical Formula 14]

(a1-1)

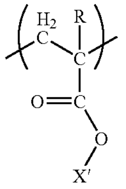

-continued (a1-2)

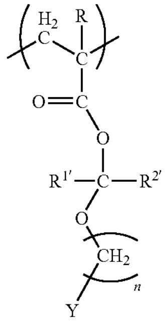

(a1-3)

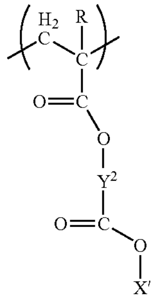

(a1-4)

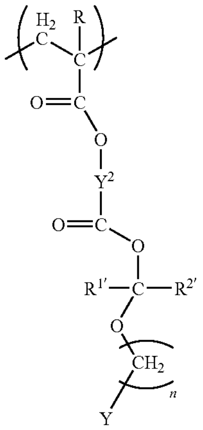

In the formulas, X' represents a tertiary alkyl ester-type acid dissociable, dissolution inhibiting group; Y represents an alkyl group of 1 to 5 carbon atoms or an aliphatic cyclic group; n represents an integer of 0 to 3; $Y^2$ represents a divalent linking group; R is the same as defined above; and each of $R^{1'}$ and $R^{2'}$ independently represents a hydrogen atom or an alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^{1'}$, $R^{2'}$, n and Y are respectively the same as defined for $R^{1'}$, $R^{2'}$, n and Y in general formula (p1) described above in connection with the "acetal-type acid dissociable, dissolution inhibiting group".

As examples of $Y^2$, the same groups as those described above for $Y^2$ in general formula (a1-0-2) can be given.

Specific examples of structural units represented by general formula (a 1-1) to (a1-4) are shown below.

In the formulas shown below, $R^{\alpha}$ represents a hydrogen atom, a methyl group or a trifluoromethyl group.

[Chemical Formula 15]

(a1-1-1)

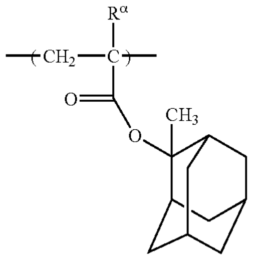

(a1-1-2)

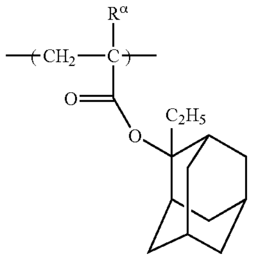

(a1-1-3)

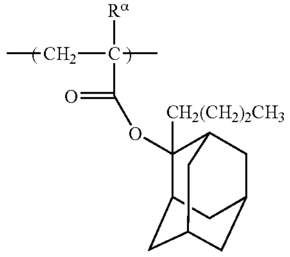

(a1-1-4)

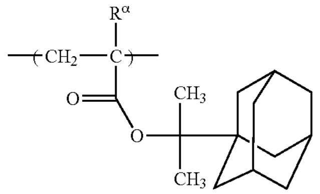

(a1-1-5)

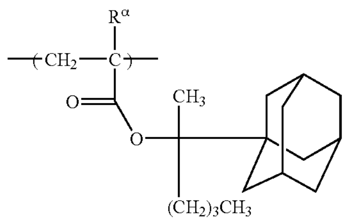

(a1-1-6)

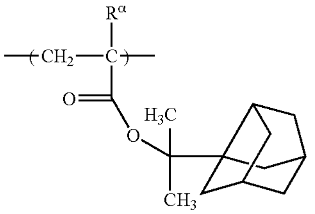

-continued
(a1-1-7)
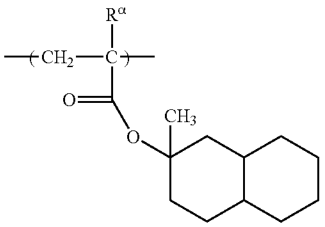
(a1-1-8)
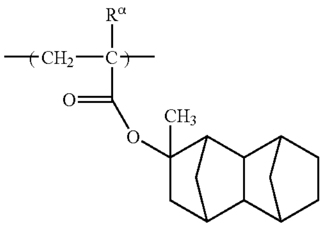
(a1-1-9)
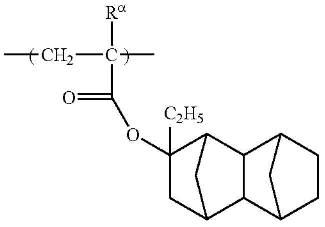
(a1-1-10)
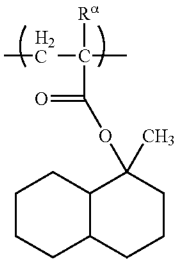
(a1-1-11)
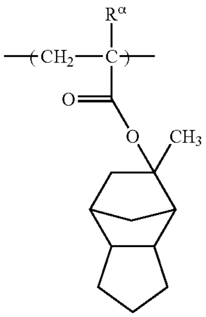
(a1-1-12)
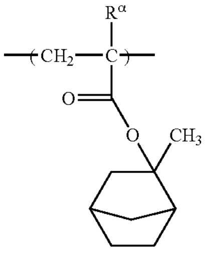
-continued
(a1-1-13)
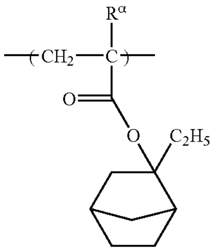
(a1-1-14)
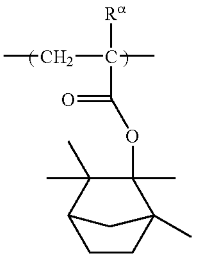
(a1-1-15)
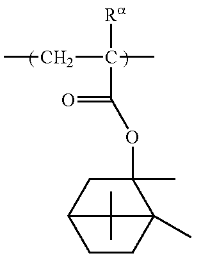
(a1-1-16)
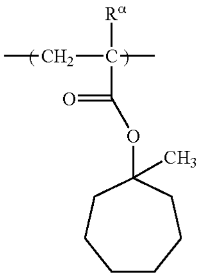
(a1-1-17)
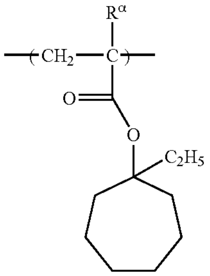
(a1-1-18)
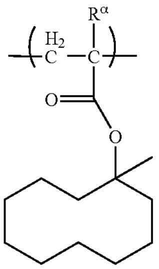

-continued
(a1-1-19)
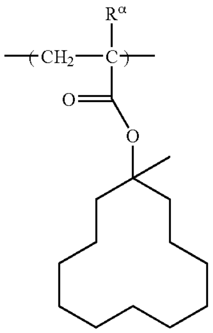
(a1-1-20)
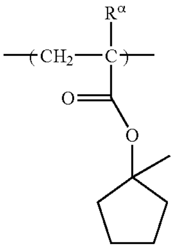
(a1-1-21)
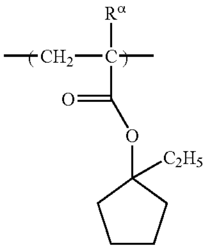
[Chemical Formula 16]
(a1-1-22)
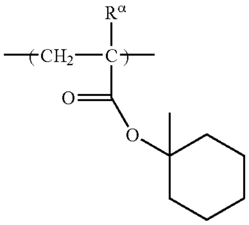
(a1-1-23)
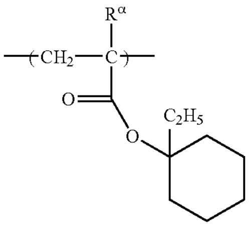
(a1-1-24)
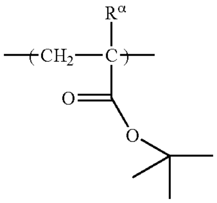
-continued
(a1-1-25)
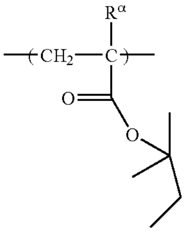
(a1-1-26)
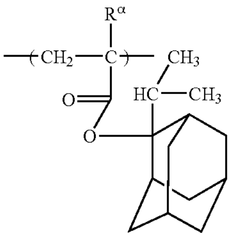
(a1-1-27)
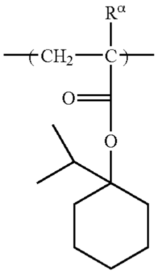
(a1-1-28)
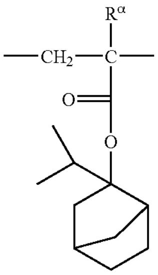
(a1-1-29)
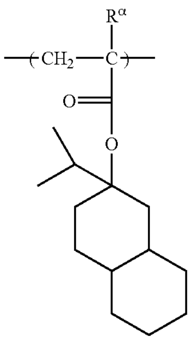

-continued
(a1-1-30)
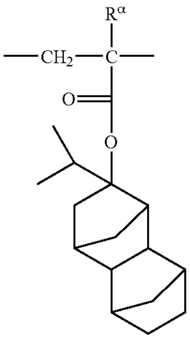
(a1-1-31)
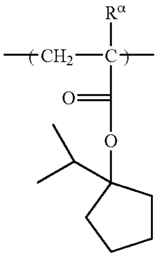
[Chemical Formula 17]
(a1-2-1)
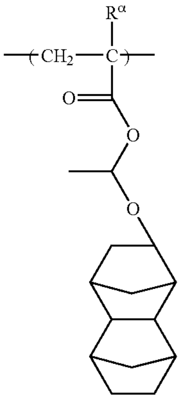
(a1-2-2)
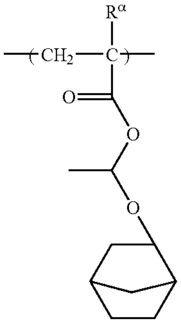
-continued
(a1-2-3)
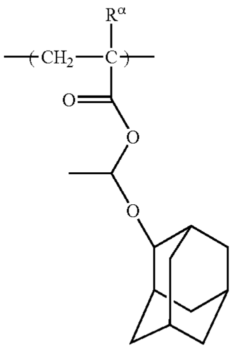
(a1-2-4)
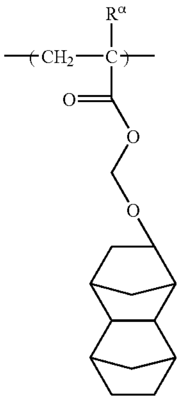
(a1-2-5)
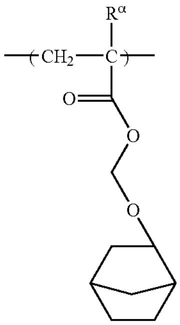
(a1-2-6)
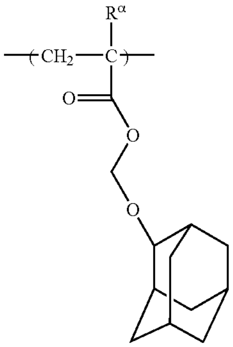

-continued
(a1-2-7)
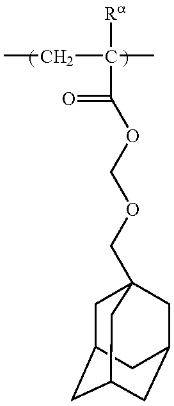
(a1-2-8)
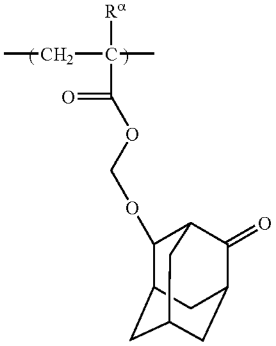
(a1-2-9)
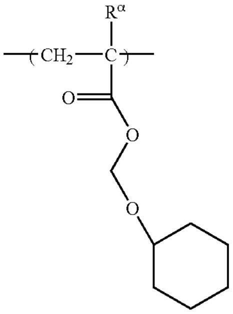
(a1-2-10)
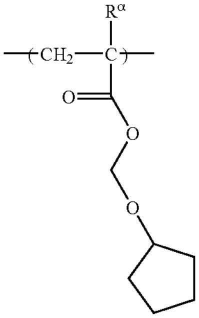
-continued
(a1-2-11)
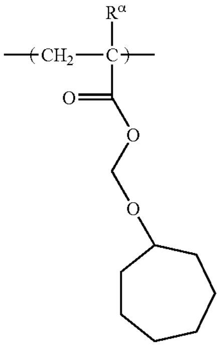
(a1-2-12)
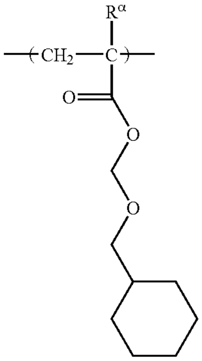
(a1-2-13)
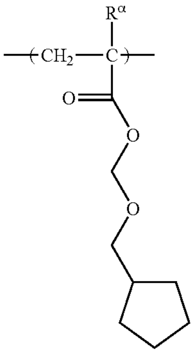
(a1-2-14)
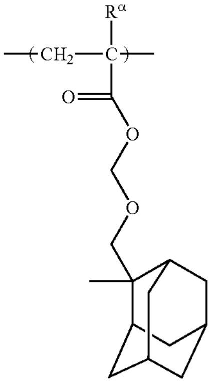

-continued
(a1-2-15)
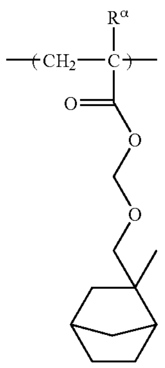
(a1-2-16)
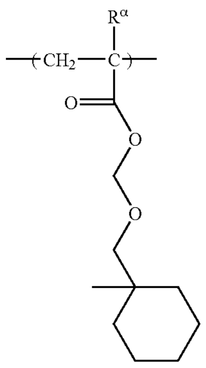
(a1-2-17)
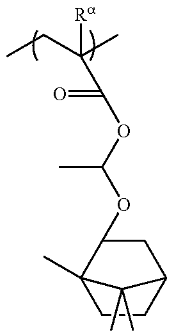
(a1-2-18)
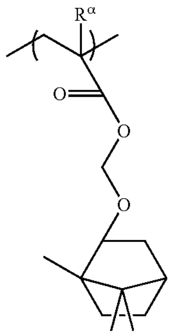
-continued
(a1-2-19)
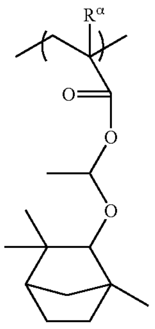
(a1-2-20)
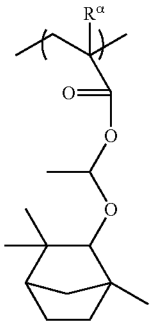
(a1-2-21)
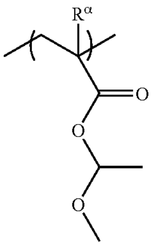
(a1-2-22)
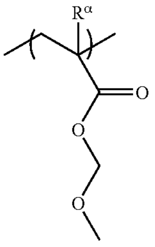
(a1-2-23)
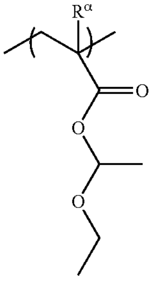

-continued
(a1-2-24)
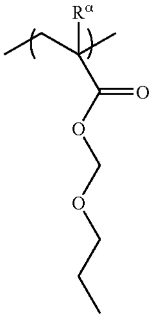
[Chemical Formula 18]
(a1-3-1)
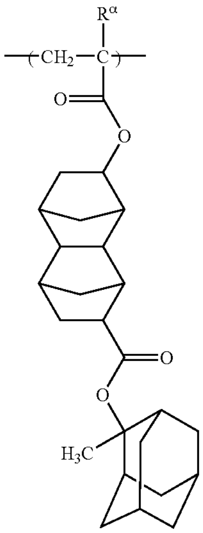
(a1-3-2)
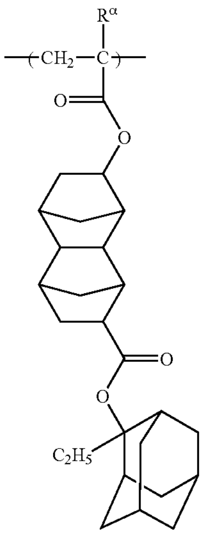
-continued
(a1-3-3)
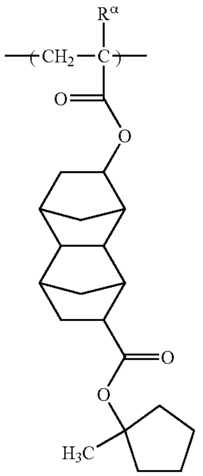
(a1-3-4)
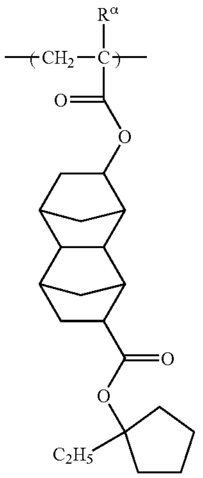
(a1-3-5)
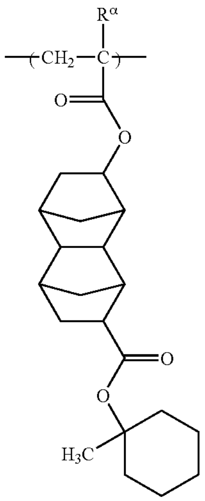

-continued
(a1-3-6)
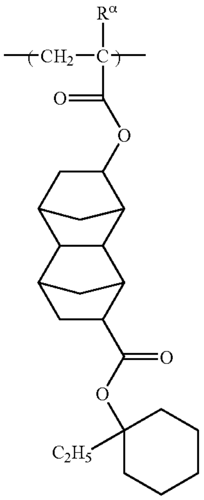
(a1-3-7)
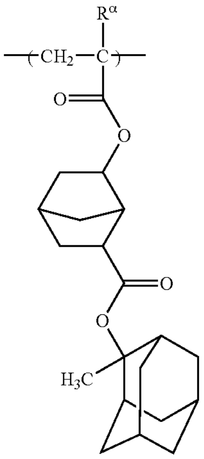
(a1-3-8)
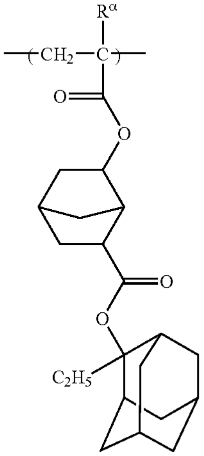
-continued
(a1-3-9)
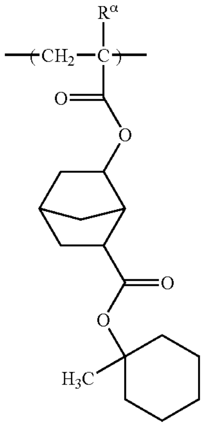
(a1-3-10)
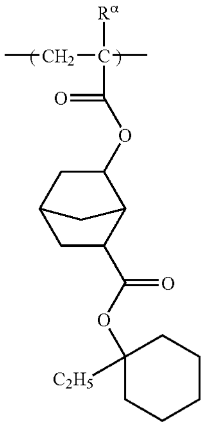
(a1-3-11)
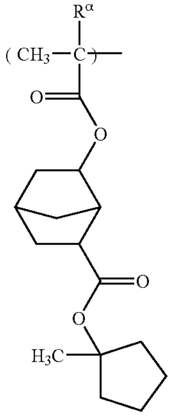

-continued
(a1-3-12)
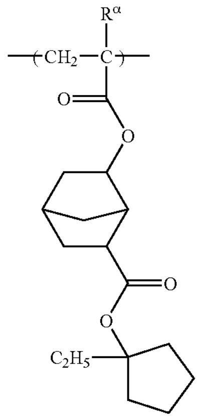
(a1-3-13)
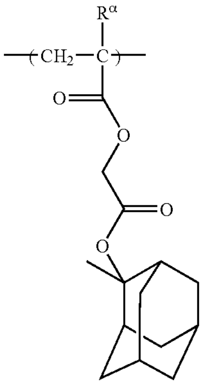
(a1-3-14)
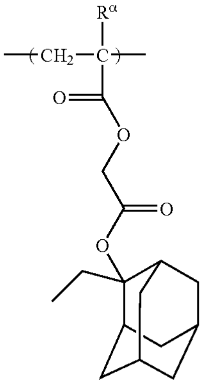
(a1-3-15)
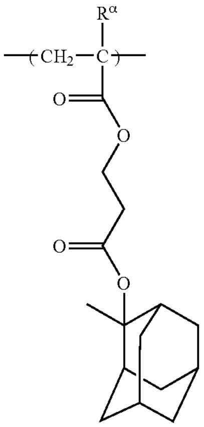
-continued
(a1-3-16)
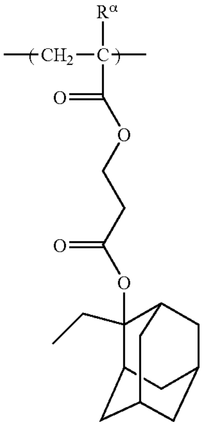
(a1-3-17)
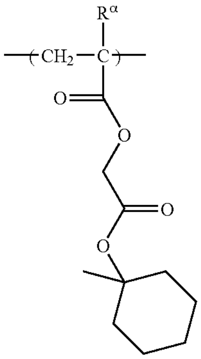
(a1-3-18)
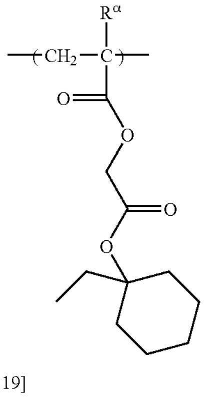
[Chemical Formula 19]
(a1-3-19)
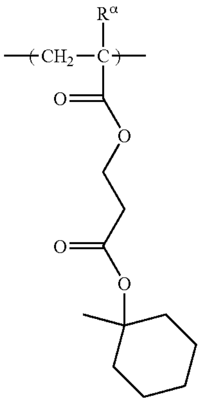

-continued
(a1-3-20)
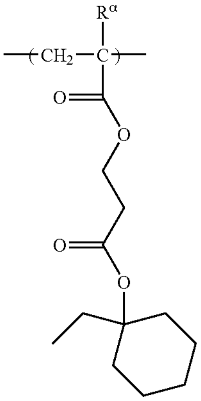
(a1-3-21)
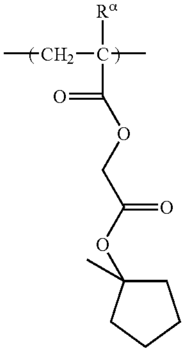
(a1-3-22)
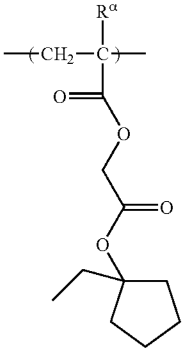
(a1-3-23)
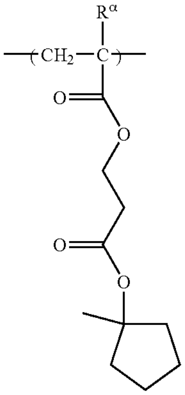
-continued
(a1-3-24)
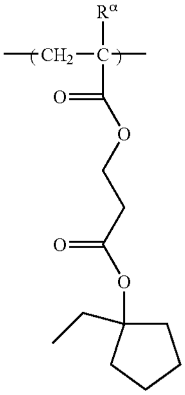
[Chemical Formula 20]
(a1-3-25)
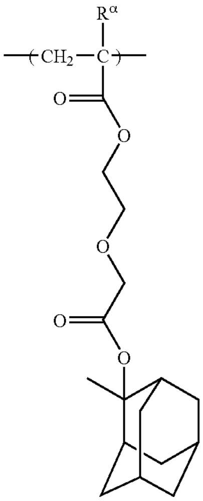
(a1-3-26)
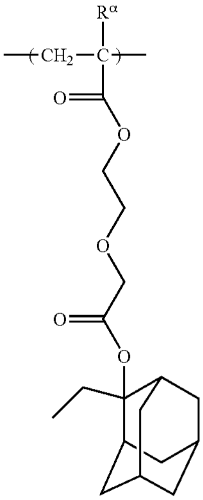

-continued
(a1-3-27)
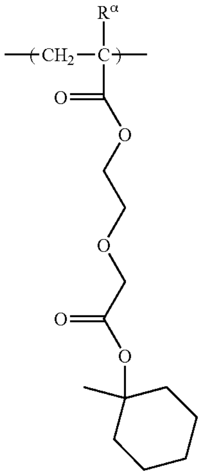
(a1-3-28)
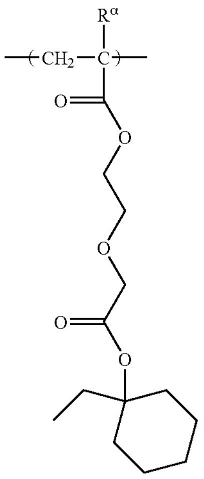
(a1-3-29)
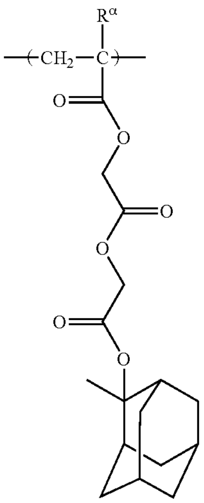
-continued
(a1-3-30)
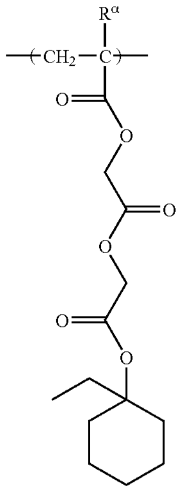
(a1-3-31)
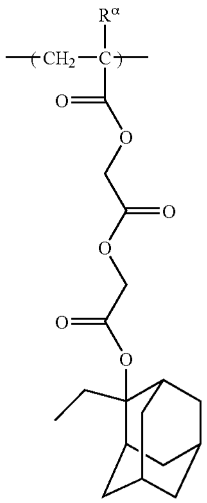
(a1-3-32)
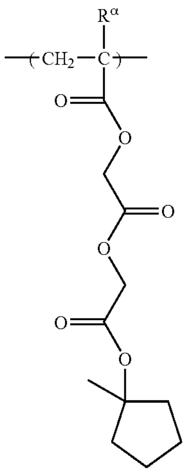

-continued
[Chemical Formula 21]
(a1-4-1)
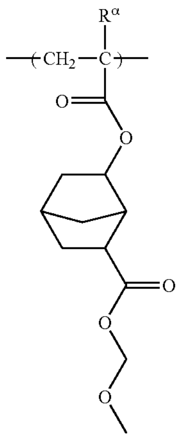
(a1-4-2)
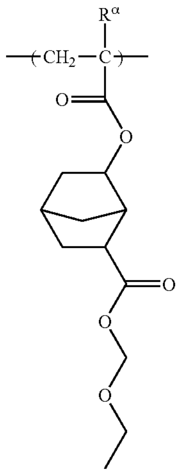
(a1-4-3)
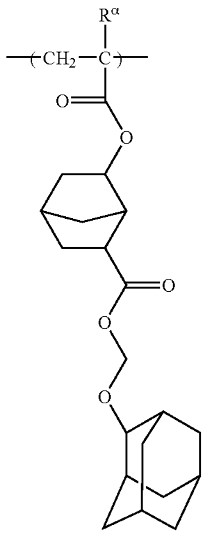
-continued
(a1-4-4)
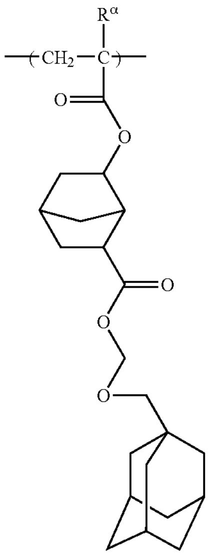
(a1-4-5)
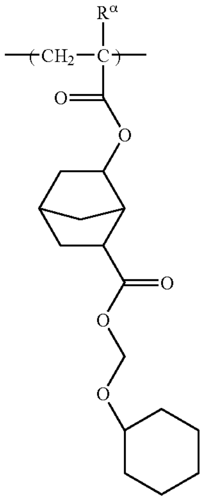
(a1-4-6)
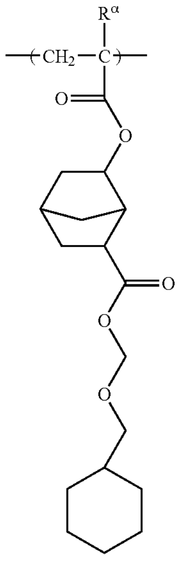

-continued
(a1-4-7)
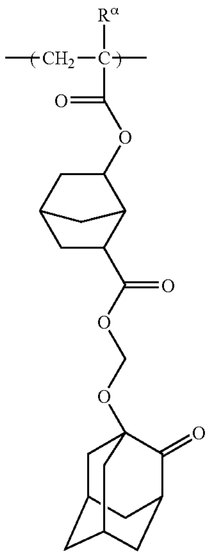
(a1-4-8)
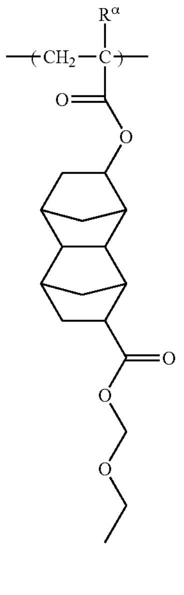
-continued
(a1-4-9)
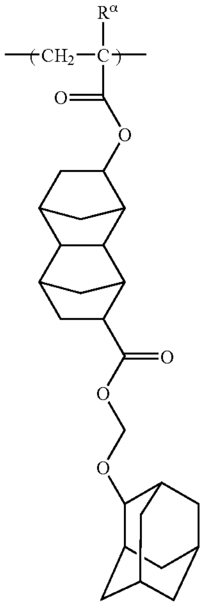
(a1-4-10)
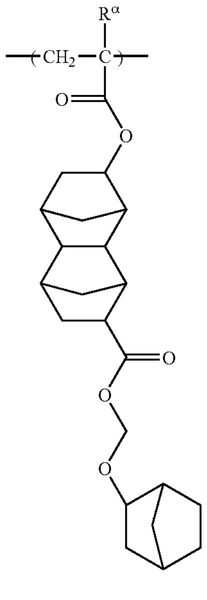

-continued
(a1-4-11)
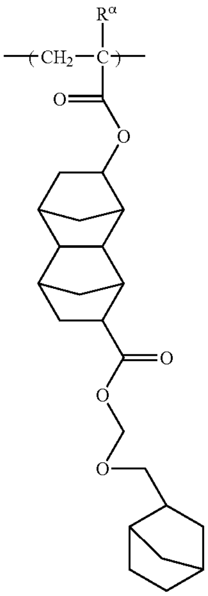
(a1-4-12)
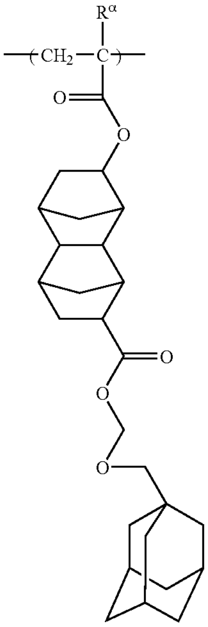
-continued
(a1-4-13)
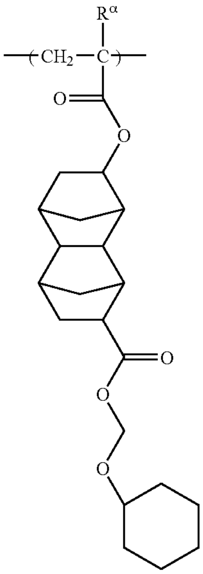
(a1-4-14)
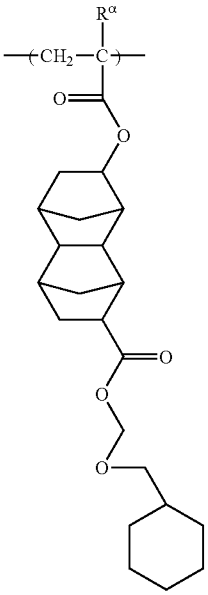

-continued (a1-4-15)

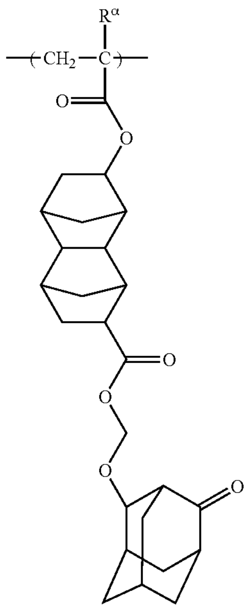

As the structural unit (a1), one type of structural unit may be used, or two or more types may be used in combination.

In the present invention, in terms of achieving excellent lithography properties with respect to resolution, the shape of resist pattern and the like, it is particularly desirable that the structural unit (a1) includes at least one structural unit selected from the group consisting of a structural unit represented by general formula (a1-0-11) shown below, a structural unit represented by general formula (a1-0-12) shown below and a structural unit represented by general formula (a1-0-2) shown below.

[Chemical Formula 22]

(a1-0-11)

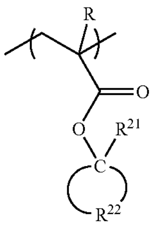

(a1-0-12)

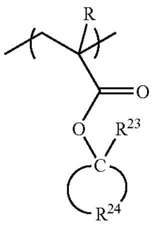

-continued (a1-0-2)

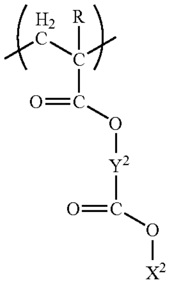

In the formulas, R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom to which $R^{22}$ is bonded; $R^{23}$ represents a branched alkyl group; $R^{24}$ represents a group which forms an aliphatic polycyclic group with the carbon atom to which $R^{24}$ is bonded; $Y^2$ represents a divalent linking group; and $X^2$ represents an acid dissociable, dissolution inhibiting group.

In the formulas, R, $Y^2$ and $X^2$ are the same as defined above.

In general formula (a1-0-11), as the alkyl group for $R^{21}$, the same alkyl groups as those described above for $R^{14}$ in formulas (1-1) to (1-9) can be used, preferably a methyl group or an ethyl group, and most preferably an ethyl group.

As the aliphatic monocyclic group formed by $R^{22}$ and the carbon atoms to which $R^{22}$ is bonded, the same aliphatic cyclic groups as those described above for the aforementioned tertiary alkyl ester-type acid dissociable, dissolution inhibiting group and which are monocyclic can be used. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

The monocycloalkane may or may not have part of the carbon atoms constituting the ring replaced with an ethereal oxygen atom (—O—).

Further, the monocycloalkane may have a substituent such as an alkyl group of 1 to 5 carbon atoms, a fluorine atom or a fluorinated alkyl group.

As an examples of $R^{22}$ constituting such an aliphatic cyclic group, an alkylene group which may have an ethereal oxygen atom (—O—) interposed between the carbon atoms can be given.

Specific examples of structural units represented by general formula (a1-0-11) include structural units represented by the aforementioned formulas (a1-1-16) to (a1-1-23). Among these, a structural unit represented by general formula (a1-1-02) shown below which includes the structural units represented by the aforementioned formulas (a1-1-16), (a1-1-17) and (a1-1-20) to (a1-1-23) is preferable. Further, a structural unit represented by general formula (a1-1-02') shown below is also preferable.

In the formulas shown below, h is preferably 1 or 2, and most preferably 2.

[Chemical Formula 23

(a1-1-02)

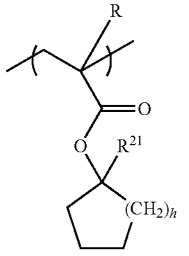

(a1-1-02')

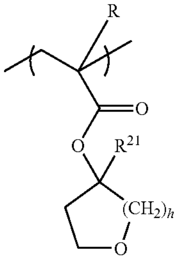

In the formulas, R and $R^{21}$ are the same as defined above; and h represents an integer of 1 to 3.

In general formula (a1-0-12), as the branched alkyl group for $R^{23}$, the same alkyl groups as those described above for $R^{14}$ which are branched can be used, and an isopropyl group is particularly desirable.

As the aliphatic polycyclic group formed by $R^{24}$ and the carbon atoms to which $R^{24}$ is bonded, the same aliphatic cyclic groups as those described above for the aforementioned tertiary alkyl ester-type acid dissociable, dissolution inhibiting group and which are polycyclic can be used.

Specific examples of structural units represented by general formula (a1-0-12) include structural units represented by the aforementioned formulas (a1-1-26) to (a1-1-31).

Examples of structural units represented by general formula (a1-0-2) include structural units represented by the aforementioned formulas (a1-3) and (a1-4).

As a structural unit represented by general formula (a1-0-2), those in which $Y^2$ is a group represented by the aforementioned formula -A-O-B- or -A-C(=O)—O-B- is particularly desirable.

Preferable examples of such structural units include a structural unit represented by general formula (a1-3-01) shown below, a structural unit represented by general formula (a1-3-02) shown below, and a structural unit represented by general formula (a1-3-03) shown below.

[Chemical Formula 24]

(a1-3-01)

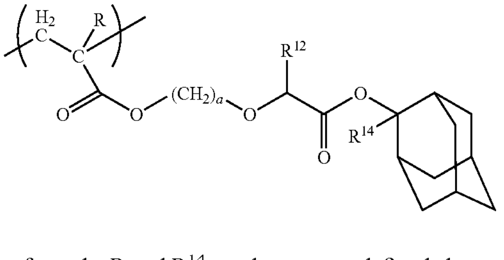

In the formula, R and $R^{14}$ are the same as defined above; $R^{12}$ represents a hydrogen atom or a methyl group; and a represents an integer of 1 to 10.

[Chemical Formula 25]

(a1-3-02)

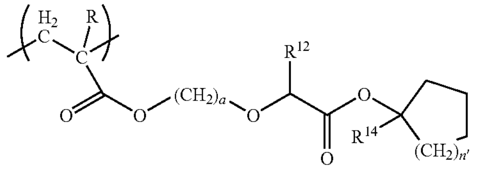

In the formula, R and $R^{14}$ are the same as defined above; $R^{12}$ represents a hydrogen atom or a methyl group; a represents an integer of 1 to 10; and n' represents an integer of 0 to 3.

[Chemical Formula 26]

(a1-3-03)

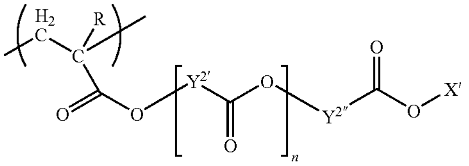

In the formula, R is as defined above; each of $Y^{2'}$ and $Y^{2''}$ independently represents a divalent linking group; X' represents an acid dissociable, dissolution inhibiting group; and n represents an integer of 1 to 3.

In general formulas (a1-3-01) and (a1-3-02), $R^{12}$ is preferably a hydrogen atom.

a is preferably an integer of 1 to 8, more preferably 1 to 5, and most preferably 1 or 2.

n' is preferably 1 or 2, and most preferably 2.

Specific examples of structural units represented by general formula (a1-3-01) include structural units represented by the aforementioned formulas (a1-3-25) and (a1-3-26).

Specific examples of structural units represented by general formula (a1-3-02) include structural units represented by the aforementioned formulas (a1-3-27) and (a1-3-28).

In general formula (a1-3-03), as the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable, dissolution inhibiting group for X', the same groups as those described above can be used. X' is preferably a tertiary alkyl ester-type acid dissociable, dissolution inhibiting group, more preferably the aforementioned group (i) which has a tertiary carbon atom on the ring structure of a monovalent aliphatic cyclic group. Among the aforementioned groups (i), a group represented by general formula (1-1) above is preferable.

n represents an integer of 0 to 3, preferably an integer of 0 to 2, more preferably 0 or 1, and most preferably 1.

As the structural unit represented by general formula (a1-3-03), a structural unit represented by general formula (a1-3-03-1) shown below which encompasses structural units represented by the aforementioned formula (a1-3-29) or (a1-3-31), or a structural unit represented by general formula (a1-3-03-2) shown below which encompasses structural units represented by the aforementioned formula (a1-3-30) or (a1-3-32) is particularly desirable. Among these, a structural unit represented by the formula (a1-3-03-1) is preferable.

[Chemical Formula 27]

(a1-3-03-1)

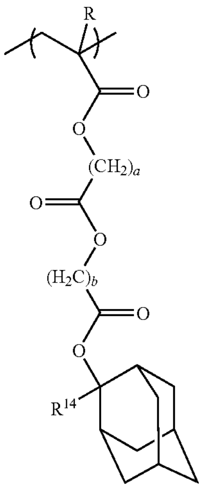

(a1-3-03-2)

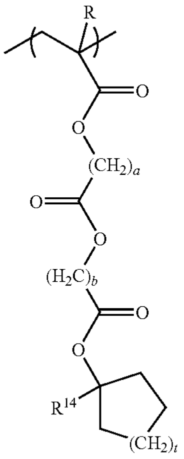

In the formulas, R and $R^{14}$ are the same as defined above; a represents an integer of 1 to 10; b represents an integer of 1 to 10; and t represents an integer of 0 to 3.

a is preferably an integer of 1 to 5, and most preferably 1 or 2.

b is preferably an integer of 1 to 5, and most preferably 1 or 2.

t is preferably an integer of 1 to 3, and most preferably 1 or 2.

In the component (A1), as the structural unit (a1), one type of structural unit may be used alone, or two or more types of structural units may be used in combination.

In the present invention, it is particularly desirable to include at least two types of structural units as the structural unit (a1). As a result, the lithography properties can be further improved. The structural unit (a1) within the component (A1) preferably includes 2 to 4 types of structural units, more preferably 2 or 3 types of structural units.

When the structural unit (a1) includes at least two types of structural units, it is preferable that at least one of the at least two structural units is a structural unit selected from the group consisting of a structural unit represented by general formula (a1-0-11), a structural unit represented by general formula (a1-0-12) and a structural unit represented by general formula (a1-0-2).

The structural unit (a1) including at least two types of structural units may consist of structural units selected from the group consisting of a structural unit represented by general formula (a1-0-11), a structural unit represented by general formula (a1-0-12) and a structural unit represented by general formula (a1-0-2). Alternatively, the structural unit (a1) may be a combination of at least one structural unit selected from the aforementioned group and a structural unit which does not fall under the category of the aforementioned group.

As examples of the structural unit which can be used in combination with at least one structural unit selected from the group consisting of a structural unit represented by general formula (a1-0-11), a structural unit represented by general formula (a1-0-12) and a structural unit represented by general formula (a1-0-2) and does not fall under the category of the aforementioned group, a structural unit represented by general formula (a1-1-01) shown below which includes the structural units represented by the aforementioned (a1-1-1), (a1-1-2), (a1-1-7) to (a1-1-15) described above as specific examples of structural units represented by general formula (a1-1), structural units represented by general formula (a1-2) and structural units represented by general formula (a1-4) can be given.

As a structural unit represented by general formula (a1-1-01), a structural unit represented by general formula (a1-1-101) shown below which includes the aforementioned formulas (a1-1-1) and (a1-1-2) is particularly desirable.

[Chemical Formula 28]

(a1-1-01)

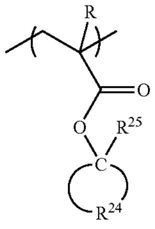

(a1-1-101)

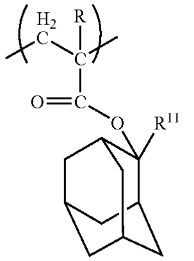

In the formulas, R is the same as defined above; each of $R^{25}$ and $R^{11}$ independently represents a linear alkyl group of 1 to 5 carbon atoms; and $R^{24}$ is the same as defined above.

In the component (A1), the amount of the structural unit (a1) based on the combined total of all structural units constituting the component (A1) is preferably 10 to 80 mol %, more preferably 20 to 70 mol %, and still more preferably 25 to 60 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a3))

The structural unit (a3) is a structural unit derived from an acrylate ester containing a hydroxy group-containing aliphatic hydrocarbon group and is represented by the aforementioned general formula (a3-1).

In formula (a3-1), R is the same as defined for R in the aforementioned formula (a0-1).

Each of Ra, Rb and Rc independently represents a hydrogen atom, an alkyl group of 1 to 5 carbon atoms, a hydroxyl group or a hydroxyalkyl group.

As the alkyl group for Ra, Rb and Rc, the same alkyl groups as those described above for R can be used.

The hydroxyalkyl group is a group in which part or all of the hydrogen atoms within an alkyl group have been substituted with a hydroxyl group. The alkyl group within the hydroxyalkyl group is the same as defined for the alkyl group represented by R. It is particularly desirable that the hydroxyalkyl group has one hydroxyl group.

At least one of Ra, Rb and Rc represents a hydroxyl group or a hydroxyalkyl group.

In the present invention, it is preferable that one or two of Ra, Rb and Rc represent a hydroxyl group or a hydroxyalkyl group, and the remaining two or one of Ra, Rb and Rc represent a hydrogen atom. Further, it is particularly desirable that one or two of Ra, Rb and Rc represent a hydroxyl group, and the remaining two or one of Ra, Rb and Rc represent a hydrogen atom.

Rd represents a single bond or a divalent linking group. As examples of the divalent linking group for Rd, the same divalent linking groups as those described above for $R^2$ in the aforementioned formula (a0-1) can be given.

As Rd, an alkylene group, an ester bond (—C(=O)—O—) or a combination of these is preferable. As the alkylene group within the divalent linking group for Rd, a linear or branched alkylene group is preferable. Specific examples include the same linear alkylene groups and branched alkylene groups as those described above for the aliphatic hydrocarbon group represented by $R^2$.

As Rd, a single bond or -Rd'-C(=O)—O— (in the formula, Rd' represents a linear or branched alkylene group) is particularly desirable.

The linear or branched alkylene group for Rd' preferably has 1 to 10 carbon atoms, more preferably 1 to 8 carbon atoms, still more preferably 1 to 5 carbon atoms, still more preferably 1 to 3 carbon atoms, and most preferably 1 or 2 carbon atoms.

As the linear alkylene group for Rd', a methylene group or an ethylene group is preferable, and a methylene group is particularly desirable. As the branched alkylene group for Rd', an alkylmethylene group or an alkylethylene group is preferable, and $—CH(CH_3)—$, $—C(CH_3)_2—$ or $—C(CH_3)_2CH_2—$ is particularly desirable.

As the structural unit (a3), one type of structural unit may be used, or two or more types may be used in combination.

In the component (A1), the amount of the structural unit (a3) based on the combined total of all structural units constituting the component (A1) is in the range of 1 to 30 mol %, preferably 5 to 30 mol %, and still more preferably 5 to 25 mol %. When the amount of the structural unit (a3) is at least as large as the lower limit of the above-mentioned range, a satisfactory improvement in the heat resistance can be achieved. Further, the hydrophilicity of the component (A) is improved, and hence, the compatibility of the component (A) with the developing solution is improved. As a result, the alkali solubility of the exposed portions improves, which contributes to favorable improvements in the resolution. On the other hand, when the amount of the structural unit (a3) is no more than the upper limit of the above-mentioned range, a good balance can be achieved with the other structural units, and excellent lithography properties can be achieved. In addition, diffusion of acid generated from the component (B) can be suppressed, and excellent properties can be achieved with respect to mask error factor and resist pattern shape.

(Structural Unit (a2))

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups, in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 29]

(a2-1)

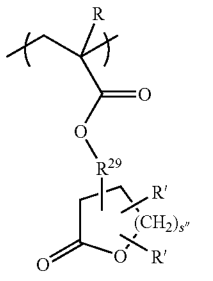

-continued (a2-2)

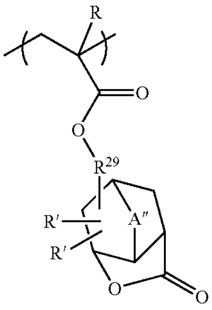

(a3-3)

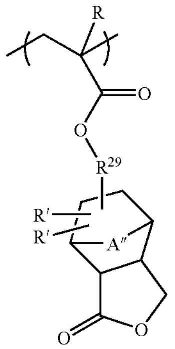

(a2-4)

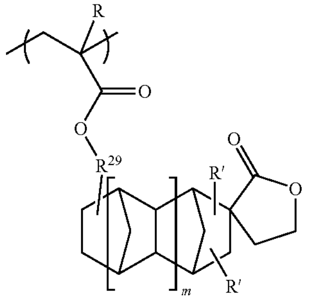

(a2-5)

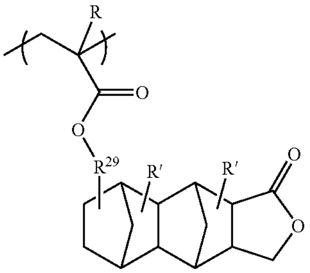

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, R' is preferably a hydrogen atom.

The alkyl group for R" may be any of linear, branched or cyclic.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As examples of A", the same groups as those described above for A' in general formula (3-1) can be given. A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylethylene group is preferable, and a methylene group is particularly desirable.

$R^{29}$ represents a single bond or a divalent linking group. As examples of the divalent linking group, the same divalent linking groups as those described above for $R^2$ in the aforementioned formula (a0-1) can be given. Among these, an alkylene group, an ester bond (—C(=O)—O—) or a combination of these is preferable. The alkylene group as a divalent linking group for $R^{29}$ is preferably a linear or branched alkylene group. Specific examples include the same linear alkylene groups and branched alkylene groups as those described above for the aliphatic hydrocarbon group represented by $R^2$.

As $R^{29}$, a single bond or —$R^{29'}$—C(=O)—O— (in the formula, $R^{29'}$ represents a linear or branched alkylene group) is particularly desirable.

The linear or branched alkylene group for $R^{29'}$ preferably has 1 to 10 carbon atoms, more preferably 1 to 8, still more preferably 1 to 5, still more preferably 1 to 3, and most preferably 1 or 2.

As the linear alkylene group for $R^{29'}$, a methylene group or an ethylene group is preferable, and a methylene group is particularly desirable. As the branched alkylene group for $R^{29'}$, an alkylmethylene group or an alkylethylene group is preferable, and —$CH(CH_3)$—, —$C(CH_3)_2$— or —$C(CH_3)_2CH_2$— is particularly desirable.

In formula (a2-1), s" is preferably 1 or 2.

Specific examples of structural units represented by general formulas (a2-1) to (a2-5) are shown below. In the formulas shown below, $R^{\alpha}$ represents a hydrogen atom, a methyl group or a trifluoromethyl group.

[Chemical Formula 30]
(a2-1-1)
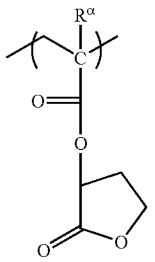
(a2-1-2)
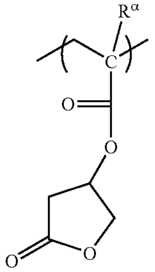
(a2-1-3)
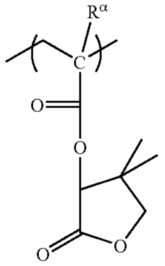
(a2-1-4)
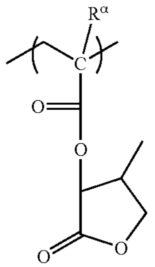
(a2-1-5)
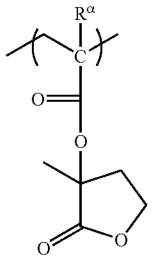
-continued
(a2-1-6)
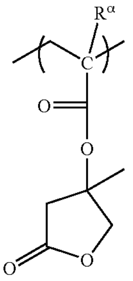
(a2-1-7)
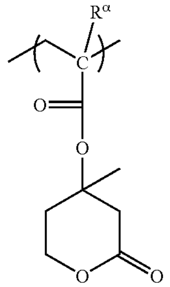
(a2-1-8)
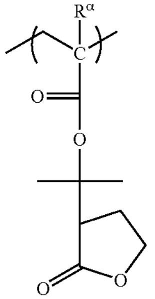
(a2-1-9)
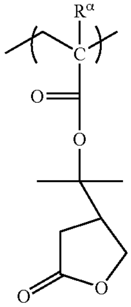
(a2-1-10)
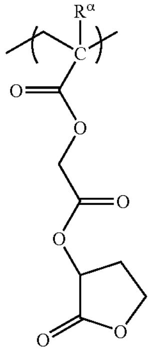

-continued
(a2-1-11)
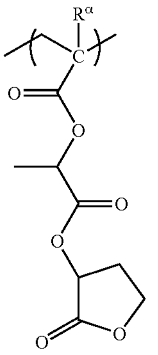
(a2-1-12)
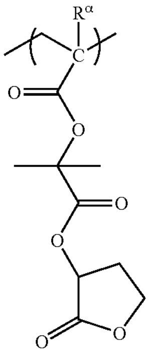
(a2-1-13)
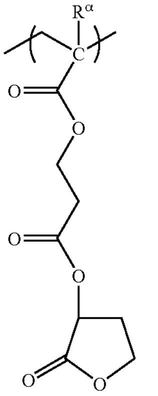
[Chemical Formula 31]
(a2-2-1)
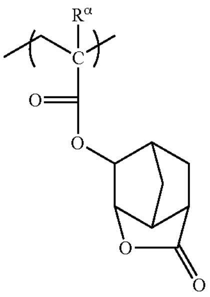
-continued
(a2-2-2)
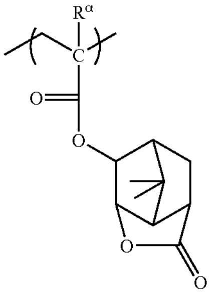
(a2-2-3)
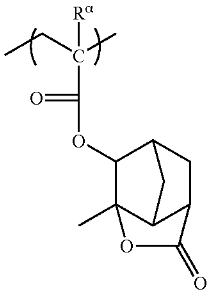
(a2-2-4)
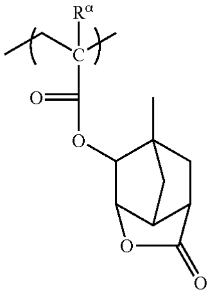
(a2-2-5)
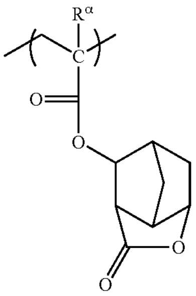
(a2-2-6)
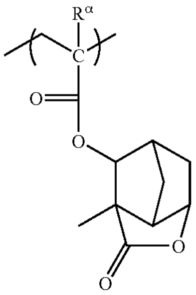

-continued
(a2-2-7)
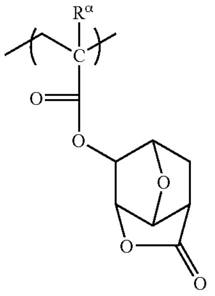
(a2-2-8)
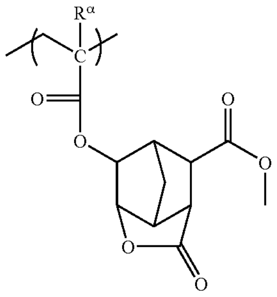
(a2-2-9)
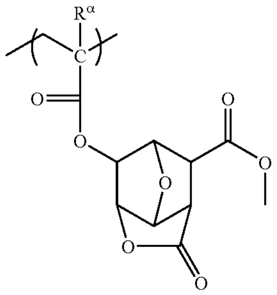
(a2-2-10)
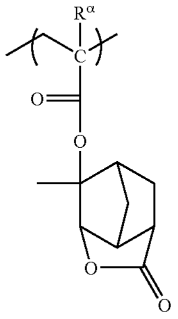
(a2-2-11)
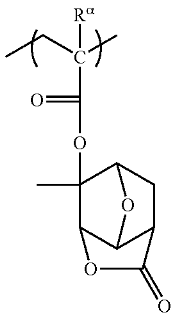
-continued
(a2-2-12)
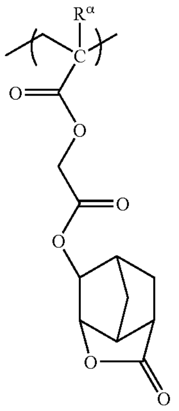
(a2-2-13)
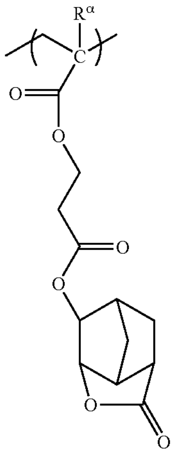
(a2-2-14)
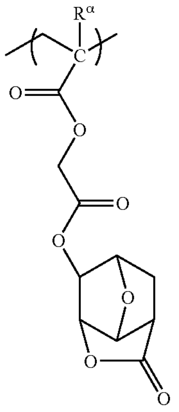

-continued
(a2-2-15)
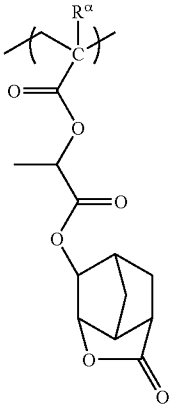
(a2-2-16)
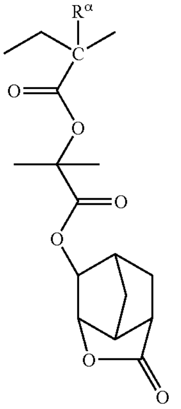
(a2-2-17)
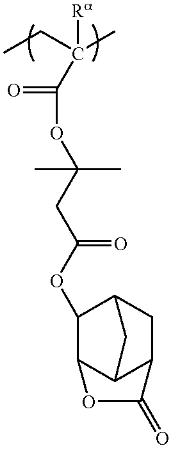
[Chemical Formula 32]
(a2-3-1)
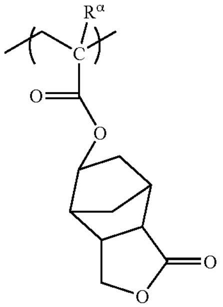
-continued
(a2-3-2)
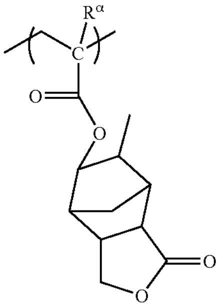
(a2-3-3)
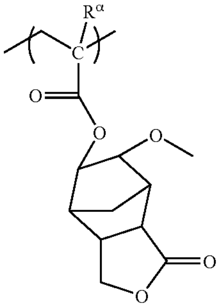
(a2-3-4)
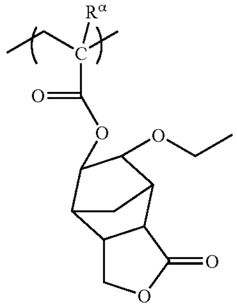
(a2-3-5)
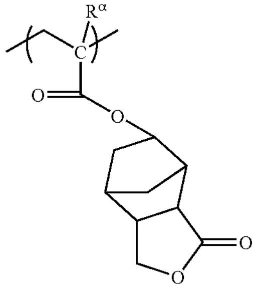
(a2-3-6)
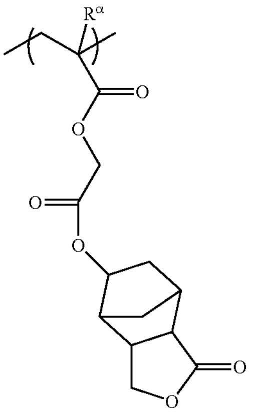

-continued
(a2-3-7)
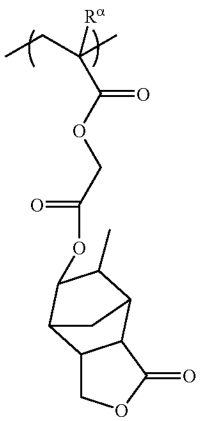
(a2-3-8)
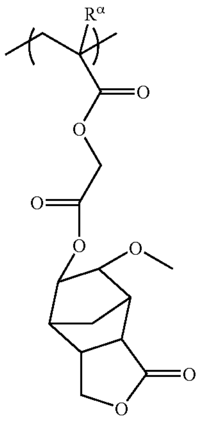
(a2-3-9)
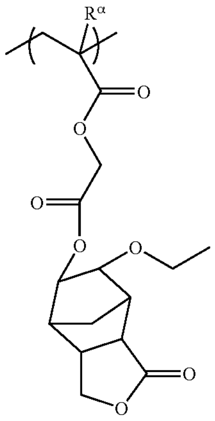
-continued
(a2-3-10)
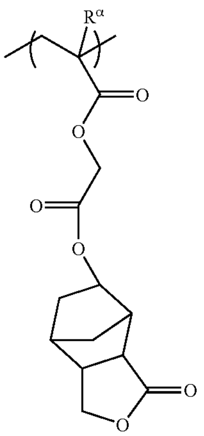
[Chemical Formula 33]
(a2-4-1)
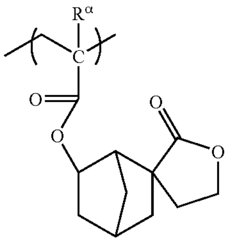
(a2-4-2)
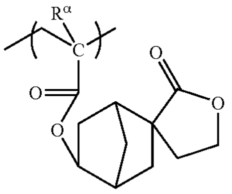
(a2-4-3)
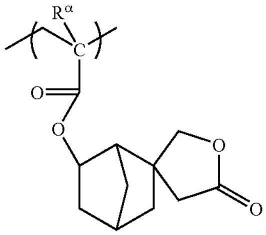
(a2-4-4)
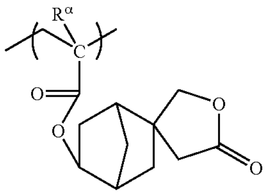
(a2-4-5)
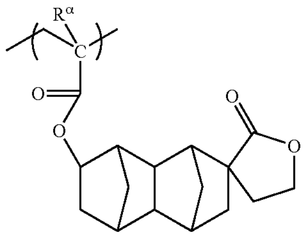

-continued
(a2-4-6)
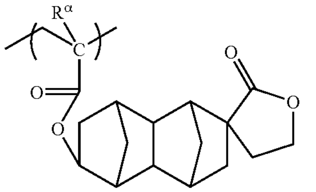
(a2-4-7)
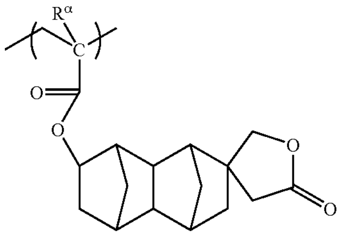
(a2-4-8)
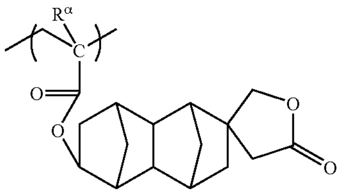
(a2-4-9)
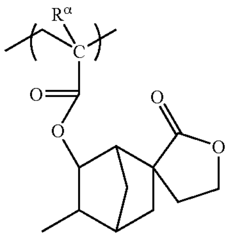
(a2-4-10)
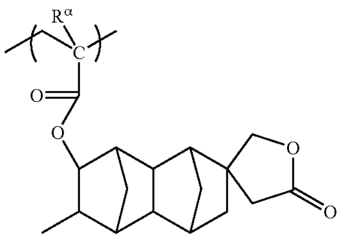
(a2-4-11)
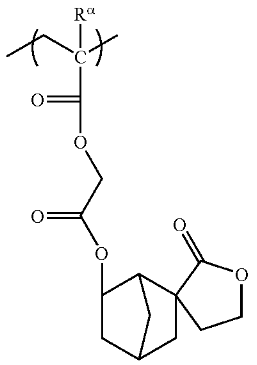
-continued
(a2-4-12)
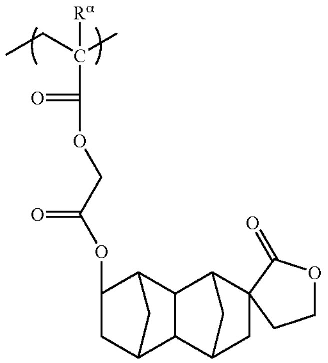
[Chemical Formula 34]
(a2-5-1)
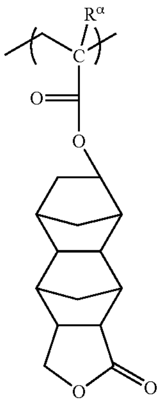
(a2-5-2)
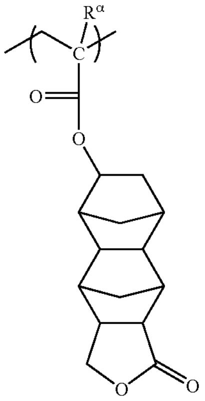
(a2-5-3)
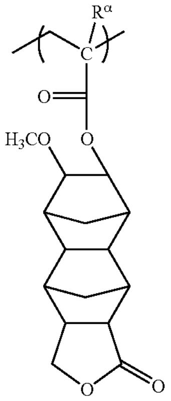

-continued (a2-5-4)

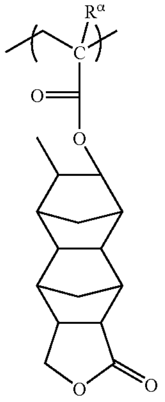

(a2-5-5)

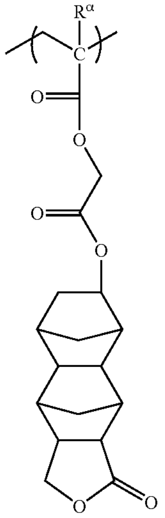

(a2-5-6)

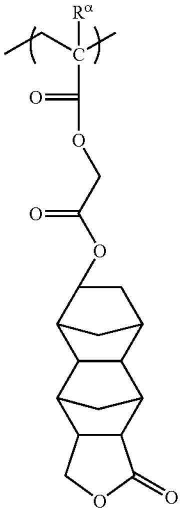

In the component (A1), as the structural unit (a2), one type of structural unit may be used, or two or more types may be used in combination.

In the present invention, as the structural unit (a2) within the component (A1), it is preferable to include at least one structural unit selected from the group consisting of structural units represented by the aforementioned general formulas (a2-1) to (a2-5), more preferably at least one structural unit selected from the group consisting of structural units represented by the aforementioned general formulas (a2-1) to (a2-3), and most preferably at least one structural unit selected from the group consisting of structural units represented by the aforementioned general formulas (a2-1) and (a2-2).

In terms of improving the adhesion between a substrate and a resist film formed using a positive resist composition containing the component (A1) and increasing the compatibility with a developing solution, the amount of the structural unit (a2) within the component (A1), based on the combined total of all structural units constituting the component (A1) is preferably 1 to 50 mol %, more preferably 5 to 50 mol %, and still more preferably 10 to 45 mol %. By ensuring the above-mentioned range, MEF, CDU and the pattern shape can be further improved.

Further, in terms of achieving excellent lithography properties, the total amount of the structural unit (a0) and the structural unit (a2) (the amount of the structural unit (a0) when the component (A1) contains no structural unit (a2)) within the component (A1), based on the combined total of all structural units constituting the component (A1) is preferably 1 to 70 mol %, more preferably 5 to 70 mol %, still more preferably 10 to 65 mol %, and most preferably 20 to 65 mol %. By ensuring the above-mentioned range, MEF, CDU and the pattern shape can be further improved.

When the component (A1) contains both of the structural unit (a0) and the structural unit (a2), the amount of the structural unit (a0) within the component (A1), based on the combined total of all structural units constituting the component (A1) is preferably 1 to 40 mol %, more preferably 10 to 35 mol %, and most preferably 15 to 30 mol %; and the amount of the structural unit (a2) within the component (A1), based on the combined total of all structural units constituting the component (A1) is preferably 1 to 45 mol %, more preferably 10 to 45 mol %, and most preferably 20 to 45 mol %.

(Other Structural Units)

The component (A1) may also have a structural unit other than the above-mentioned structural units (a1) to (a3), as long as the effects of the present invention are not impaired.

As such a structural unit, any other structural unit which cannot be classified as one of the above structural units (a1) to (a3) can be used without any particular limitation, and any of the multitude of conventional structural units used within resist resins for ArF excimer lasers or KrF excimer lasers (and particularly for ArF excimer lasers) can be used.

Examples of such a structural unit include the structural units (a4) and (a3') shown below.

The structural unit (a4) is a structural unit derived from an acrylate ester containing a non-acid dissociable, aliphatic polycyclic group.

As the aliphatic polycyclic group for the structural unit (a4), any of the multitude of conventional polycyclic groups used within the resin component of resist compositions for ArF excimer lasers or KrF excimer lasers (and particularly for ArF excimer lasers) can be used. Specific examples include groups in which one or more hydrogen atoms have been removed from a polycycloalkane such as a bicycloalkane, tricycloalkane or tetracycloalkane.

As the aliphatic polycyclic group, at least one polycyclic group selected from amongst a tricyclodecyl group, adamantyl group, tetracyclododecyl group, isobornyl group, and norbornyl group is particularly desirable in consideration of industrial availability and the like.

These aliphatic polycyclic groups may have a linear or branched alkyl group of 1 to 5 carbon atoms as a substituent.

Specific examples of the structural unit (a4) include units with structures represented by general formulas (a4-1) to (a4-5) shown below.

[Chemical Formula 35]

(a4-1)

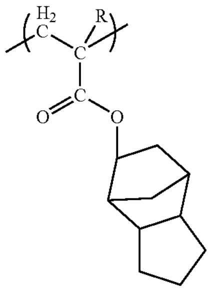

(a4-2)

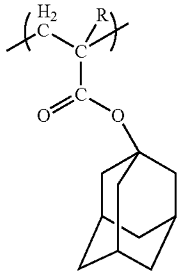

(a4-3)

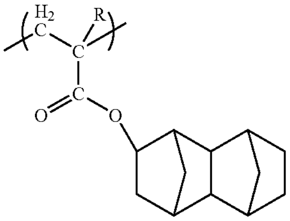

(a4-4)

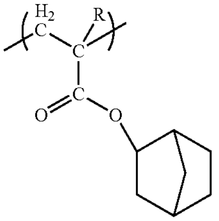

(a4-5)

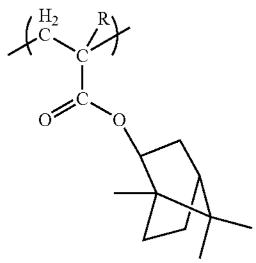

In the formulas, R is the same as defined above.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

The structural unit (a3') is a structural unit derived from an acrylate ester containing a polar group-containing aliphatic hydrocarbon group and does not fall under the category of the aforementioned structural unit (a3).

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include a polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3') is preferably a structural unit derived from a hydroxyethyl ester of acrylic acid.

On the other hand, when the hydrocarbon group is a polycyclic group, structural units represented by general formulas (a3'-2) and (a3'-3) shown below are preferable.

[Chemical Formula 36]

(a3'-2)

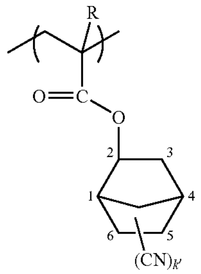

-continued

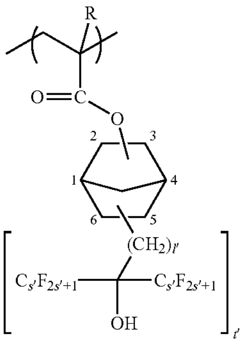

(a3'-3)

In the formulas, R is the same as defined above; k' is an integer of 1 to 3; t' is an integer of 1 to 3; l' is an integer of 1 to 5; and s' is an integer of 1 to 3.

In formula (a3'-2), k' is preferably 1. The cyano group is preferably bonded to the 5th or 6th position of the norbornyl group.

In formula (a3'-3), t' is preferably 1. l' is preferably 1.

s' is preferably 1.

In formula (a3'-3), the oxygen atom (—O—) bonded to the carbonyl group is preferably bonded to the 2nd or 3rd position of the norbornane ring. Further, the fluorinated alcohol group $(—(CH_2)—C(C_sF_{2s+1})_2OH)$ is preferably bonded to the 5th or 6th position of the norbornyl group.

As the structural unit (a3'), one type of structural unit may be used, or two or more types may be used in combination.

The component (A1) is a copolymer including the structural units (a0), (a1) and (a$^3$).

Examples of such a copolymer include a copolymer consisting of the structural units (a0), (a1) and (a3), and a copolymer consisting of structural units (a0), (a1), (a2) and (a3).

In the present invention, it is particularly desirable that such a copolymer contains, as the structural unit (a1), at least one member selected from the group consisting of a structural unit represented by general formula (a1-0-11), a structural unit represented by general formula (a1-0-12), and a structural unit represented by general formula (a1-1-01).

Further, as described above, such a copolymer preferably contains at least two types of structural units as the structural unit (a1). It is more preferable that at least one of the at least two structural units is selected from the group consisting of a structural unit represented by general formula (a1-0-11) and a structural unit represented by general formula (a1-0-12). It is particularly desirable that both of the at least two types of structural units are selected from the aforementioned group.

In the present invention, as the component (A1), a copolymer including six types of structural units shown in general formula (A1-10) below, a copolymer including five types of structural units shown in any one of general formulas (A1-11) to (A1-14) below, a copolymer including four types of structural units shown in any one of general formulas (A1-15) to (A1-18) below, or a copolymer including three types of structural units shown in general formula (A1-19) or (A1-20) below is preferable.

[Chemical Formula 37]

(A1-10)

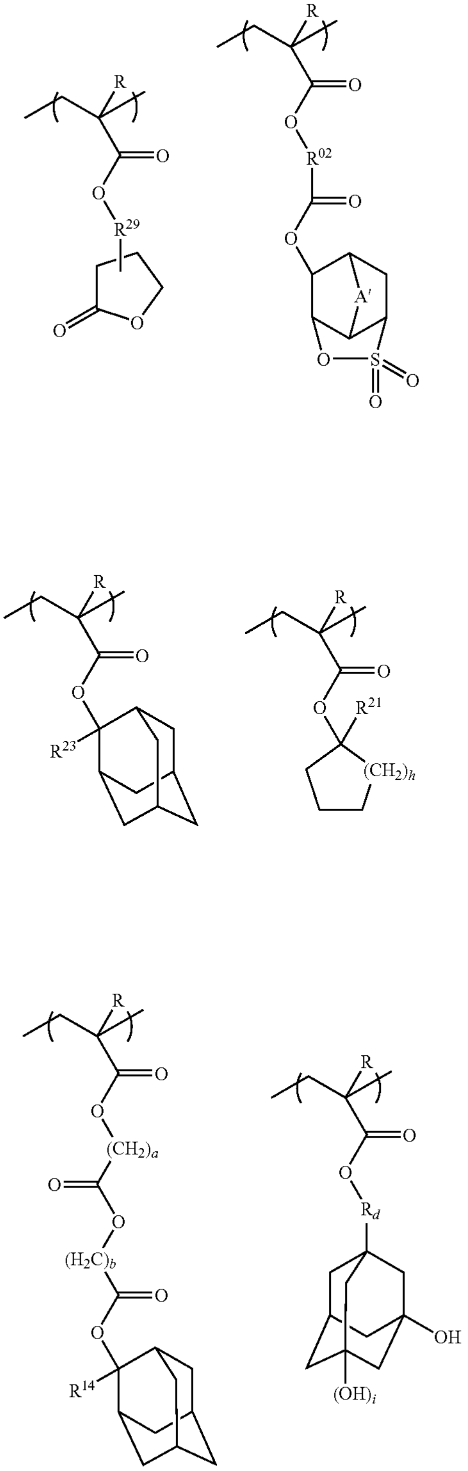

In the formula, R, $R^{29}$, $R^{02}$, A', $R^{23}$, $R^{21}$, h, a, b, $R^{14}$ and Rd are the same as defined above; i represents 0 or 1; and the plurality of R may be the same or different from each other.

[Chemical Formula 38]
(A1-11)
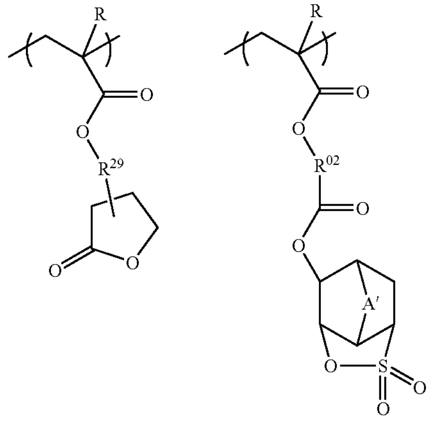
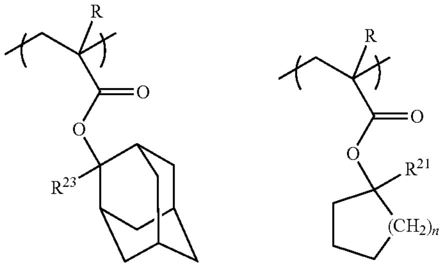
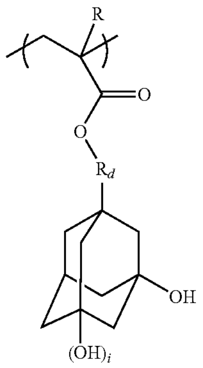
(A1-12)
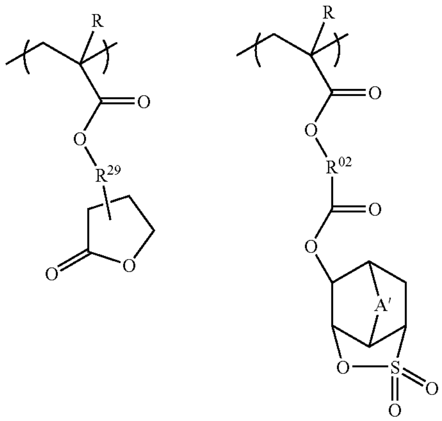
-continued
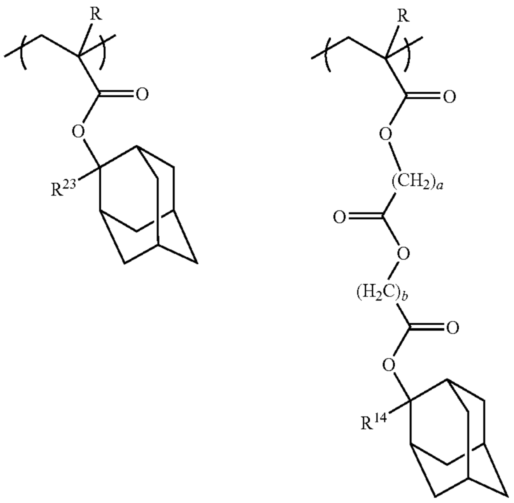
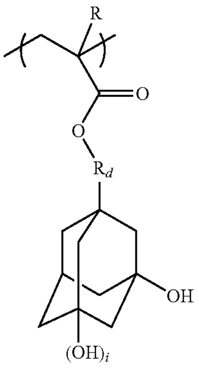
In the formulas, R, $R^{29}$, $R^{02}$, A', $R^{23}$, $R^{21}$, h, Rd, i, a, b and $R^{14}$ are the same as defined above, and the plurality of R may be the same or different from each other.
[Chemical Formula 39]
(A1-13)
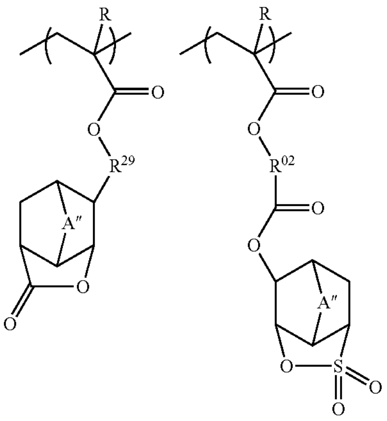

-continued
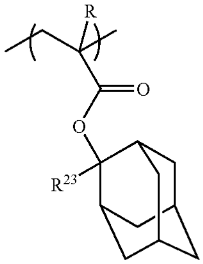
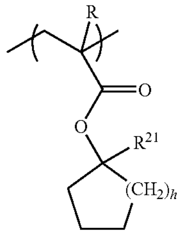
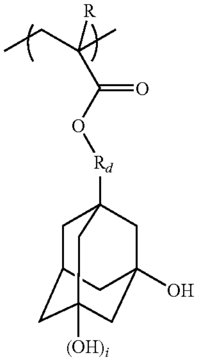
(A1-14)
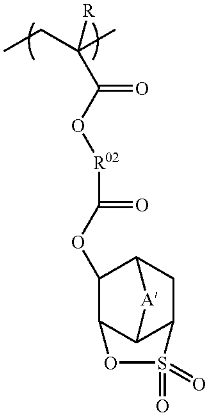
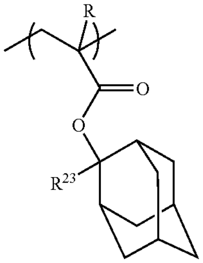
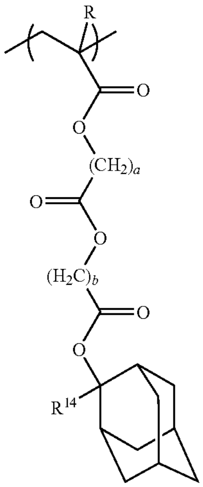
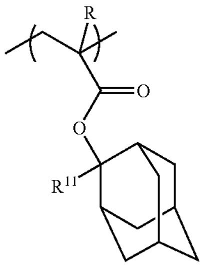
-continued
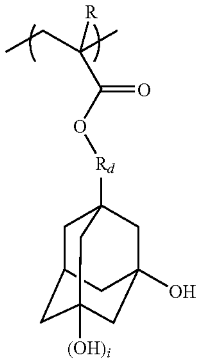
In the formulas, R, $R^{29}$, A", $R^{02}$, A', $R^{23}$, $R^{21}$, h, Rd, i, a, b, $R^{14}$ and $R^{11}$ are the same as defined above, and the plurality of R may be the same or different from each other.
[Chemical Formula 40]
(A1-15)
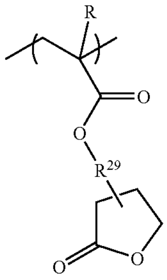
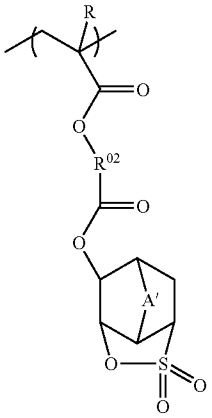
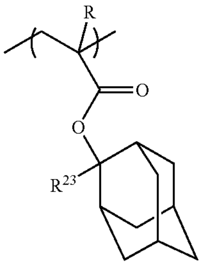
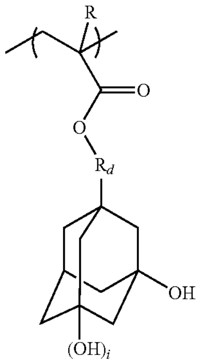

-continued
(A1-16)
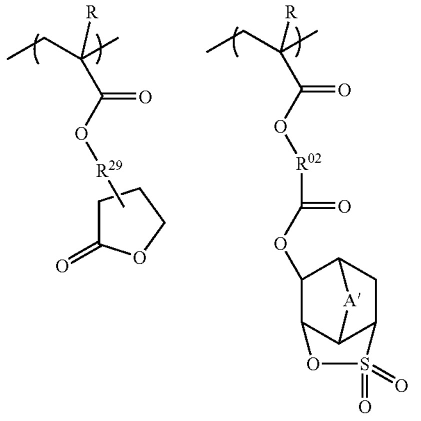
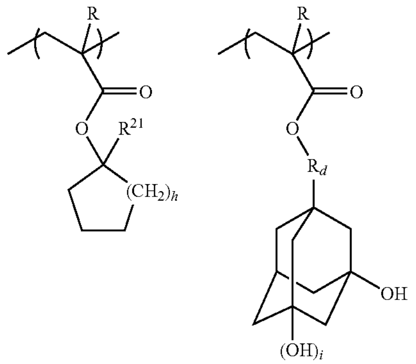
In the formulas, R, $R^{29}$, $R^{02}$, A', $R^{23}$, Rd, i, $R^{21}$ and h are the same as defined above, and the plurality of R may be the same or different from each other.
[Chemical Formula 41]
(A1-17)
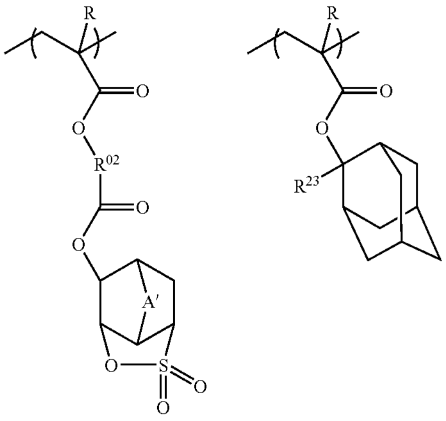
-continued
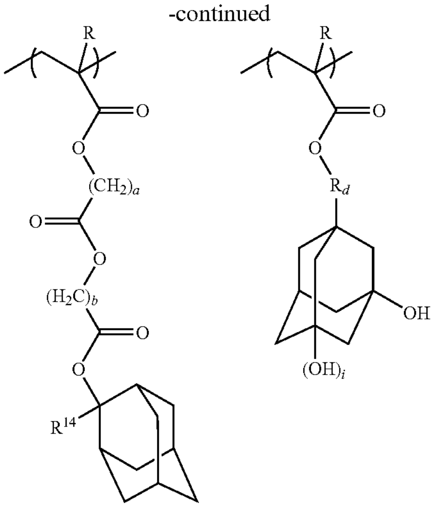
(A1-18)
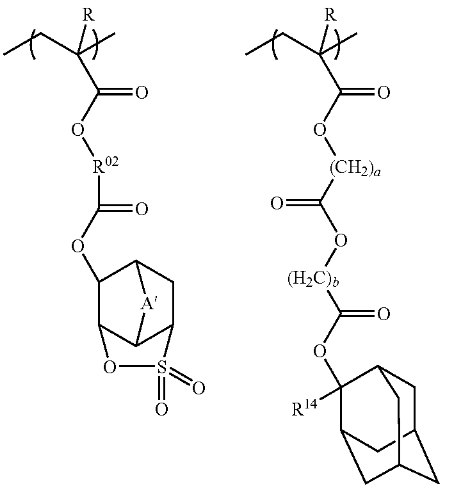
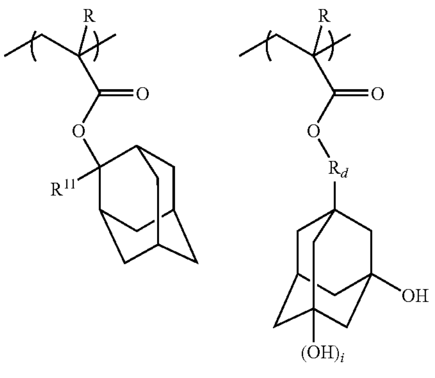
In the formulas, R, $R^{02}$, A', $R^{23}$, a, b, $R^{14}$, Rd, i and $R^{11}$ are the same as defined above, and the plurality of R may be the same or different from each other.

[Chemical Formula 42]

(A1-19)

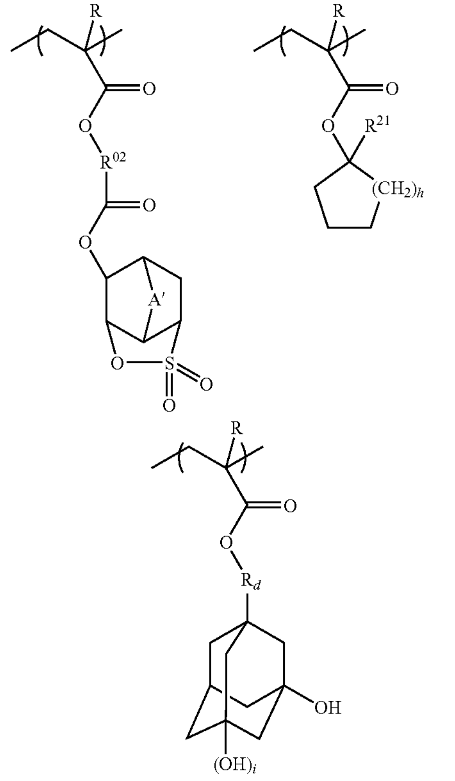

(A1-20)

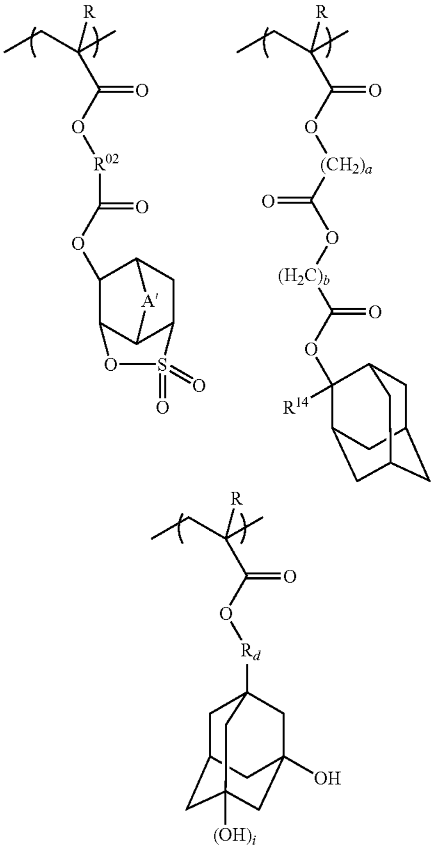

In the formulas, R, $R^{02}$, A', $R^{21}$, h, Rd, i, a, b and $R^{14}$ are the same as defined above, and the plurality of R may be the same or different from each other.

The weight average molecular weight (Mw) (the polystyrene equivalent value determined by gel permeation chromatography) of the component (A1) is not particularly limited, but is preferably 2,000 to 50,000, more preferably 3,000 to 30,000, and most preferably 5,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

In the component (A), as the component (A1), one type may be used, or two or more types of compounds may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as $HS—CH_2—CH_2—CH_2—C(CF_3)_2—OH$, a $—C(CF_3)_2—OH$ group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

For example, as a monomer for deriving the structural unit (a0), a compound represented by general formula (a0-1-0) shown below (hereafter, referred to as "compound (a0-1-0)") can be used.

[Chemical Formula 43]

(a0-1-0)

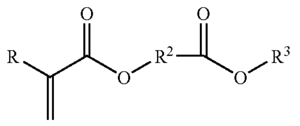

In the formula, R, $R^2$ and $R^3$ are the same as defined above.

The method for producing the compound (a0-1-0) is not particularly limited, and the compound (a0-1-0) can be produced by a conventional method.

For example, in the presence of a base, a compound (X-2) represented by general formula (X-2) shown below is added to a solution obtained by dissolving a compound (X-1) represented by general formula (X-1) shown below in a reaction solvent, and a reaction is effected to thereby obtain a compound (a0-1-0).

Examples of the base include inorganic bases such as sodium hydride, $K_2CO_3$ and $Cs_2CO_3$; and organic bases such as triethylamine, 4-dimethylaminopyridine (DMAP) and pyridine. Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids can be used individually, or in a combination of two or more.

[Chemical Formula 44]

(X-1)

(X-2)

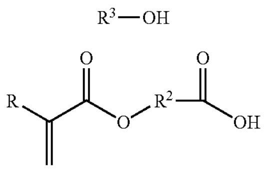

In the formula, R, $R^2$ and $R^3$ are the same as defined above.

In the resist composition of the present invention, the component (A) may contain "a base component which exhibits increased solubility in an alkali developing solution under action of acid" other than the component (A1) (hereafter, referred to as "component (A2)").

The component (A2) is not particularly limited, and any of the multitude of conventional base components used within chemically amplified resist compositions (e.g., base resins used within chemically amplified resist compositions for ArF excimer lasers or KrF excimer lasers, preferably ArF excimer lasers) can be used. For example, as a base resin for ArF excimer laser, a base resin having the aforementioned structural unit (a1) as an essential component, and optionally the aforementioned structural units (a2) to (a5) can be used. Further, the component (A2) may contain a non-polymer (low molecular weight compound) having a molecular weight of 500 to less than 4,000.

As the component (A2), one type of resin may be used, or two or more types of resins may be used in combination.

In the resist composition of the present invention, the amount of the component (A) can be appropriately adjusted depending on the thickness of the resist film to be formed, and the like.

<Component (B)>

As the component (B), there is no particular limitation, and any of the known acid generators used in conventional chemically amplified resist compositions can be used. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 45]

(b-1)

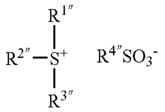

(b-2)

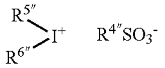

In the formulas above, $R^{1''}$ to $R^{3''}$, $R^{5''}$ and $R^{6''}$ each independently represent an aryl group or alkyl group which may have a substituent, wherein two of $R^{1''}$ to $R^{3''}$ may be bonded to each other to form a ring with the sulfur atom; and $R^{4''}$ represents an alkyl group, a halogenated alkyl group, an aryl group or an alkenyl group which may have a substituent, with the provision that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group which may have a substituent or an alkyl group which may have a substituent. In formula (b-1), two of $R^{1''}$ to $R^{3''}$ may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group of $R^{1''}$ to $R^{3''}$ is not particularly limited, and includes, for example, an aryl group of 6 to 20 carbon atoms. The aryl group is preferably an aryl group having 6 to 10 carbon atoms because it can be synthesized at a low cost. Specific examples thereof include a phenyl group and a naphthyl group.

The aryl group may have a substituent. The expression "has a substituent" means that part or all of the hydrogen atoms within the aryl group has been substituted with a substituent. Examples of the substituent include an alkyl group, an alkoxy group, a halogen atom, a hydroxyl group, an alkoxyalkyloxy group, —O—$R^{50}$—CO—O—$R^{51}$ (in the formula, $R^{50}$ represents an alkylene group, and $R^{51}$ represents an acid dissociable group).

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

Examples of the alkoxyalkyloxy group which substitutes the hydrogen atoms within the aryl group include —O—C($R^{47}$)($R^{48}$)—O—$R^{49}$ (in the formula, each of $R^{47}$ and $R^{48}$ independently represents a hydrogen atom or a linear or branched alkyl group, and $R^{49}$ represents an alkyl group, wherein $R^{48}$ and $R^{49}$ may be mutually bonded to form a ring structure, provided that at least one of $R^{47}$ and $R^{48}$ represents a hydrogen atom).

The alkyl group for $R^{47}$ and $R^{48}$ preferably has 1 to 5 carbon atoms. As the alkyl group, an ethyl group or a methyl group is preferable, and a methyl group is most preferable.

Further, it is preferable that at least one of $R^{47}$ and $R^{48}$ represent a hydrogen atom, and the other represent a hydrogen atom or a methyl group. It is particularly desirable that both of $R^{47}$ and $R^{48}$ represent a hydrogen atom.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

$R^{48}$ and $R^{49}$ may be mutually bonded to form a ring structure. In such a case, a cyclic group is formed by $R^{48}$, $R^{49}$, the oxygen atom having $R^{49}$ bonded thereto, and the carbon atom having the oxygen atom and $R^{48}$ bonded thereto. Such a cyclic group is preferably a 4- to 7-membered ring, and more preferably a 4- to 6-membered ring.

In the $—O—R^{50}—CO—O—R^{51}$ group which may substitute the hydrogen atoms within the aryl group, the alkylene group for $R^{50}$ is preferably a linear or branched alkylene group of 1 to 5 carbon atoms. Examples of the alkylene group include a methylene group, an ethylene group, a trimethylene group, a tetramethylene group and a 1,1-dimethylethylene group.

The acid dissociable group for $R^{51}$ is not particularly limited as long as it is an organic group that is dissociable by the action of an acid (generated from the component (B) upon exposure), and examples thereof include the same acid dissociable, dissolution inhibiting groups as those described above for the aforementioned structural unit (a1). However, unlike the aforementioned acid dissociable, dissolution inhibiting group, the acid dissociable group is not necessarily required to exhibit the dissolution inhibiting effect in an alkali developing solution.

Specific examples of the acid dissociable group include a tertiary alkyl ester-type acid dissociable group such as a cyclic or chain-like tertiary alkyl group; and an acetal-type acid dissociable group such as an alkoxyalkyl group. Among these, a tertiary alkyl ester-type acid dissociable group is preferable.

Specific examples of the tertiary alkyl ester-type acid dissociable group include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

The alkyl group for $R^{1}$" to $R^{3}$" is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkyl group may have a substituent. The expression "has a substituent" means that part or all of the hydrogen atoms within the alkyl group has been substituted with a substituent. Examples of the substituent include the same groups as those described above for the substituent of the aforementioned aryl group.

When two of $R^{1}$" to $R^{3}$" in formula (b-1) are bonded to each other to form a ring with the sulfur atom, it is preferable that the two of $R^{1}$" to $R^{3}$" form a 3 to 10-membered ring including the sulfur atom, and it is particularly desirable that the two of $R^{1}$" to $R^{3}$" form a 5 to 7-membered ring including the sulfur atom.

When two of $R^{1}$" to $R^{3}$" in formula (b-1) are bonded to each other to form a ring with the sulfur atom, the remaining one of $R^{1}$" to $R^{3}$" is preferably an aryl group. As examples of the aryl group, the same as the above-mentioned aryl groups for $R^{1}$" to $R^{3}$" can be given.

As preferable examples of the cation moiety for the compound represented by general formula (b-1), those represented by formulas (I-1-1) to (I-1-13) shown below can be given. Among these, in terms of improving the lithography properties, a cation moiety having a triphenylmethane skeleton, such as a cation moiety represented by any one of formulas (I-1-3), (I-1-5) to (I-1-7), (I-1-11) to (I-1-13) shown below is particularly desirable.

In formulas (I-1-9) and (I-1-10), each of $R^{9}$ and $R^{10}$ independently represents a phenyl group or naphthyl group which may have a substituent, an alkyl group of 1 to 5 carbon atoms, an alkoxy group or a hydroxy group.

u is an integer of 1 to 3, and most preferably 1 or 2.

[Chemical Formula 46]

(I-1-1)

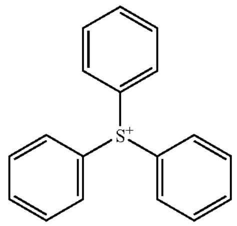

-continued
(I-1-2)
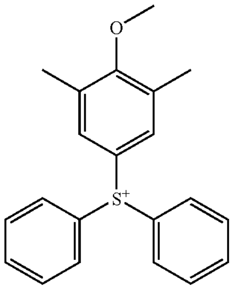
(I-1-3)
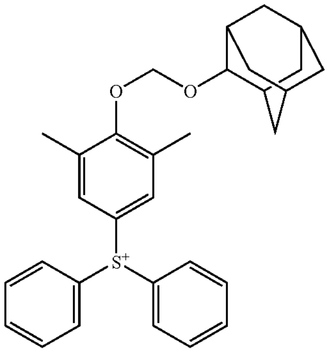
(I-1-4)
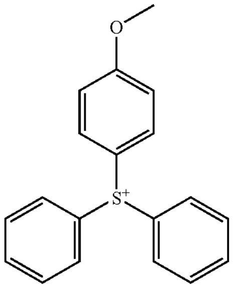
(I-1-5)
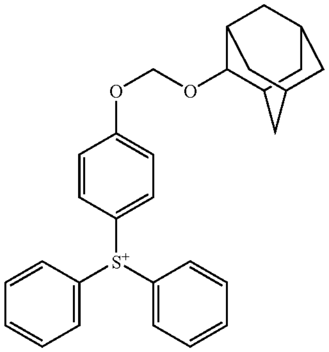
(I-1-6)
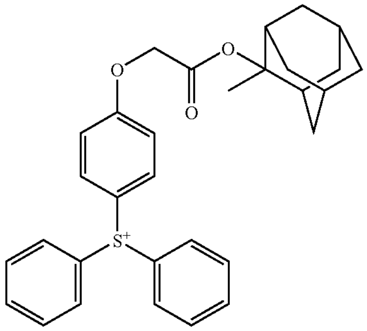
-continued
[Chemical Formula 47]
(I-1-7)
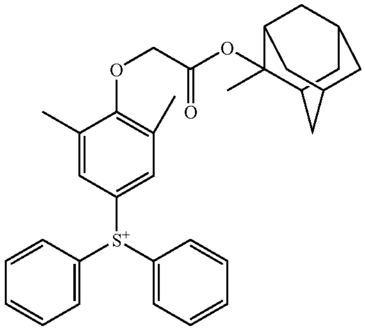
(I-1-8)
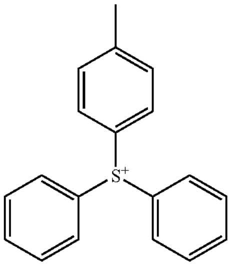
(I-1-9)
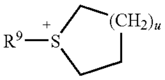
(I-1-10)
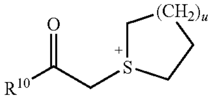
(I-1-11)
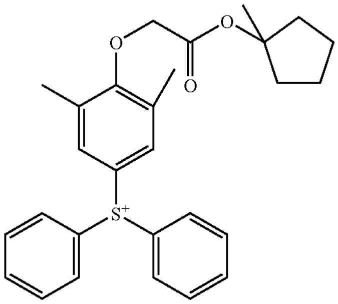
(I-1-12)
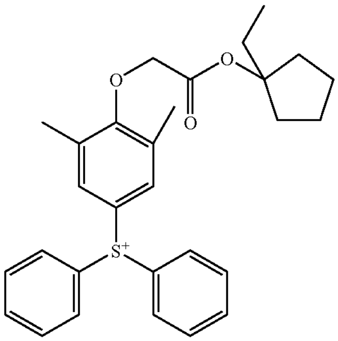

-continued (I-1-13)

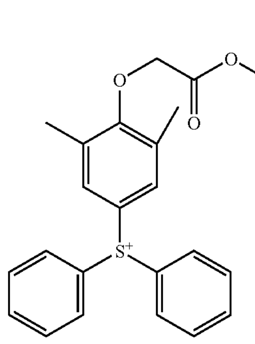

$R^{4''}$ represents an alkyl group, a halogenated alkyl group, an aryl group or an alkenyl group which may have a substituent.

The alkyl group for $R^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratio is preferable because the acid strength increases.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4''}$ may have one substituent, or two or more substituents.

Examples of the substituent include a halogen atom, a hetero atom, an alkyl group, and a group represented by the formula X-$Q^1$- (in the formula, $Q^1$ represents a divalent linking group containing an oxygen atom; and X represents a hydrocarbon group of 3 to 30 carbon atoms which may have a substituent).

Examples of halogen atoms and alkyl groups as substituents for $R^{4''}$ include the same halogen atoms and alkyl groups as those described above with respect to the halogenated alkyl group for $R^{4''}$.

Examples of hetero atoms include an oxygen atom, a nitrogen atom, and a sulfur atom.

In the group represented by formula X-$Q^1$-, $Q^1$ represents a divalent linking group containing an oxygen atom.

$Q^1$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate group (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)—, —C(=O)—O—$R^{93}$— and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—$CH_2$—]; alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; an ethylene group [—$CH_2CH_2$—]; alkylethylene groups such as —$CH(CH_3)CH_2$—, —$CH(CH_3)CH(CH_3)$—, —$C(CH_3)_2CH_2$— and —$CH(CH_2CH_3)CH_2$—; a trimethylene group (n-propylene group) [—$CH_2CH_2CH_2$—]; alkyltrimethylene groups such as —$CH(CH_3)CH_2CH_2$— and —$CH_2CH(CH_3)CH_2$—; a tetramethylene group [—$CH_2CH_2CH_2CH_2$—]; alkyltetramethylene groups such as —$CH(CH_3)CH_2CH_2CH_2$— and —$CH_2CH(CH_3)CH_2CH_2$—; and a pentamethylene group [—$CH_2CH_2CH_2CH_2CH_2$—].

$Q^1$ is preferably a divalent linking group containing an ester linkage or ether linkage, and more preferably a group of —$R^{91}$—O—, —$R^{92}$—O—C(=O)—, —C(=O)—O—, —C(=O)—O—$R^{93}$—, or —C(=O)—O—$R^{93}$—O—C(=O)—.

In the group represented by the formula X-$Q^1$-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" for X, there is no particular limitation as long as it is an atom other than a carbon atom and a hydrogen atom. Examples of hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —C(=O)—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(═O)—O—, —S—, —S(═O)$_2$— or —S(═O)$_2$—O—. Specific examples of such aliphatic cyclic groups include groups represented by formulas (L1) to (L5) and (S1) to (S4) shown below.

[Chemical Formula 48]

(L1)

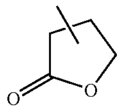

(L2)

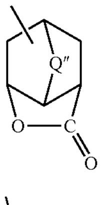

(L3)

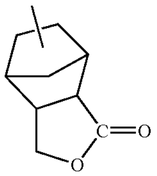

(L4)

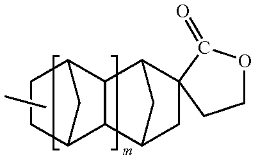

(L5)

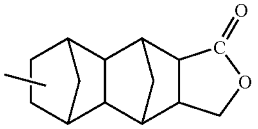

(S1)

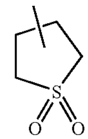

(S2)

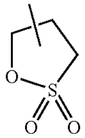

(S3)

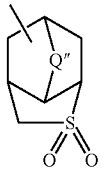

(S4)

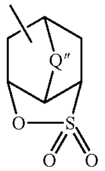

In the formula, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents 0 or 1.

As the alkylene group for Q", $R^{94}$ and $R^{95}$, the same alkylene groups as those described above for $R^{91}$ to $R^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (═O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the substituent groups for substituting part or all of the hydrogen atoms can be used.

In the present invention, as X, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

In the present invention, $R^{4"}$ preferably has X-$Q^1$- as a substituent. In such a case, $R^{4"}$ is preferably a group represented by the formula X-$Q^1$-$Y^1$— (in the formula, $Q^1$ and X are the same as defined above; and $Y^1$ represents an alkylene group of 1 to 4 carbon atoms which may have a substituent, or a fluorinated alkylene group of 1 to 4 carbon atoms which may have a substituent).

In the group represented by the formula X-$Q^1$-$Y^1$-, as the alkylene group for $Y^1$, the same alkylene group as those described above for $Q^1$ in which the number of carbon atoms is 1 to 4 can be used.

As the fluorinated alkylene group, the aforementioned alkylene group in which part or all of the hydrogen atoms has been substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —$CHF$—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include $—CF_2—$, $—CF_2CF_2—$, $—CF_2CF_2CF_2—$, $—CF(CF_3)CF_2—$, $—CF_2CF_2CF_2CF_2—$, $—CF(CF_3)CF_2CF_2—$, $—CF_2CF(CF_3)CF_2—$, $—CF(CF_3)CF(CF_3)—$, $—C(CF_3)_2CF_2—$, $—CF(CF_2CF_3)CF_2—$; $—CH_2CF_2—$, $—CH_2CH_2CF_2—$, $—CH_2CF_2CF_2—$; $—CH_2CH_2CH_2CF_2—$, $—CH_2CH_2CF_2CF_2—$, and $—CH_2CF_2CF_2CF_2—$.

Of these, $—CF_2—$, $—CF_2CF_2—$, $—CF_2CF_2CF_2—$ or $CH_2CF_2CF_2—$ is preferable, $—CF_2—$, $—CF_2CF_2—$ or $—CF_2CF_2CF_2—$ is more preferable, and $—CF_2—$ is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5}$" and $R^{6}$" each independently represent an aryl group or alkyl group. At least one of $R^{5}$" and $R^{6}$" represents an aryl group. It is preferable that both of $R^{5}$" and $R^{6}$" represent an aryl group.

As the aryl group for $R^{5}$" and $R^{6}$", the same as the aryl groups for $R^{1}$" to $R^{3}$" can be used.

As the alkyl group for $R^{5}$" and $R^{6}$", the same as the alkyl groups for $R^{1}$" to $R^{3}$" can be used.

It is particularly desirable that both of $R^{5}$" and $R^{6}$" represents a phenyl group.

As $R^{4}$" in formula (b-2), the same groups as those mentioned above for $R^{4}$" in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as methanesulfonate, n-propanesulfonate, n-butanesulfonate, n-octanesulfonate, 1-adamantanesulfonate, or 2-norbornanesulfonate, d-camphor-10-sulfonate, benzenesulfonate, perfluorobenzenesulfonate, or p-toluenesulfonate.

Furthermore, onium salts in which the anion moiety of these onium salts are replaced by an anion moiety represented by any one of formulas (b1) to (b8) shown below can be used.

[Chemical Formula 49]

(b1)

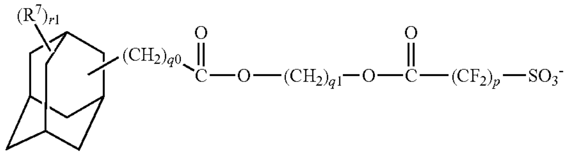

(b2)

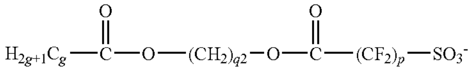

(b3)

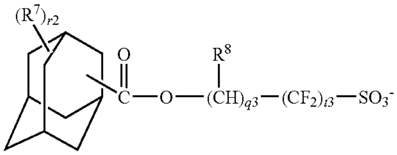

In the formulas, p represents an integer of 1 to 3; each of q0 to q2 independently represents an integer of 1 to 5; q3 represents an integer of 1 to 12; each of r1 and r2 independently represents an integer of 0 to 3; g represents an integer of 1 to 20; t3 represents an integer of 1 to 3; $R^7$ represents a substituent; and $R^8$ represents a hydrogen atom, an alkyl group of 1 to 5 carbon atoms or a halogenated alkyl group of 1 to 5 carbon atoms.

[Chemical Formula 50]

(b4)

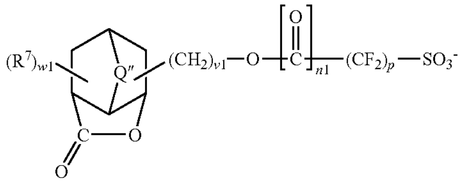

(b5)

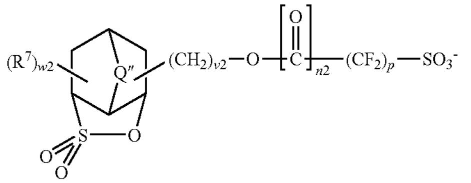

(b6)

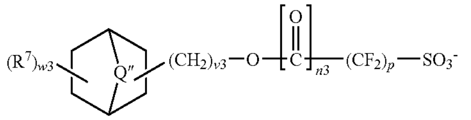

(b7)

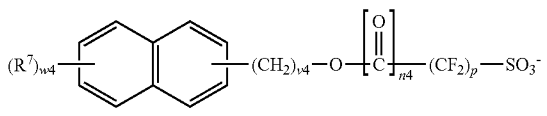

(b8)

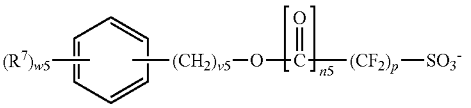

In the formulas, p, $R^7$ and Q" are the same as defined above; each of n1 to n5 independently represents 0 or 1; each of v1 to v5 independently represents an integer of 0 to 3; and each of w1 to w5 independently represents an integer of 0 to 3.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1, r2, and w1 to w5, then the two or more of the $R^7$ groups may be the same or different from each other.

$R^8$ represents a hydrogen atom, an alkyl group of 1 to 5 carbon atoms or a halogenated alkyl group of 1 to 5 carbon atoms. As the alkyl group and the halogenated alkyl group, the same alkyl groups and halogenated alkyl groups as those described above for R can be mentioned.

Each of q0 to q2, r1, r2 and w1 to w5 is preferably an integer of 0 to 2, and more preferably 0 or 1.

t3 is preferably 1 or 2, and most preferably 1.

q3 is preferably 1 to 5, more preferably 1 to 3, and most preferably 1.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 51]

(b-3)

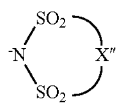

(b-4)

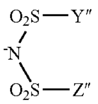

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, it is possible to use an onium salt-based acid generator represented by general formula (b-1) or (b2) in which the anion moiety ($R^{4}$"$SO_3^-$) has been replaced by $R^{7}$"—$COO^-$ (in the formula, $R^{7}$" represents an alkyl group or a fluorinated alkyl group) (the cation moiety is the same as (b-1) or (b-2)).

As $R^{7}$", the same groups as those described above for $R^{4}$" can be used.

Specific examples of the group represented by the formula "$R^{7}$"—$COO^-$" include a trifluoroacetate ion, an acetate ion, and a 1-adamantanecarboxylic acid ion.

Furthermore, as an onium salt-based acid generator, a sulfonium salt having a cation moiety represented by general formula (b-5) or (b-6) shown below may be used.

[Chemical Formula 52]

(b-5)

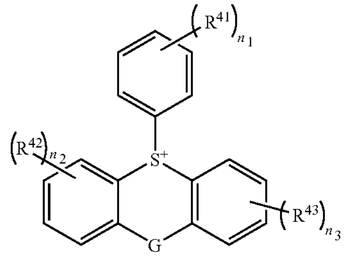

(b-6)

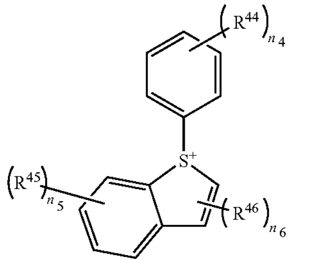

In the formulas, each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; $n_6$ represents an integer of 0 to 2; and G represents a single bond, a methylene group, a sulfur atom, an oxygen atom, a nitrogen atom, a carbonyl group, —SO—, —$SO_2$—, —$SO_3$—, —COO—, —CONH— or —$N(R_N)$— ($R_N$ represents an alkyl group of 1 to 5 carbon atoms).

With respect to $R^{41}$ to $R^{46}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4}$"$SO_3^-$) for onium salt-based acid generators represented by general formula (b-1) or (b-2) shown above; and anion moieties represented by general formula (b-3) or (b-4) shown above.

In the present description, an oximesulfonate-based acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 53]

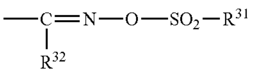

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 54]

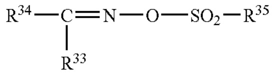

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 55]

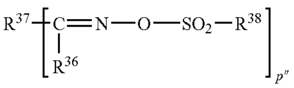

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be used.

[Chemical Formula 56]

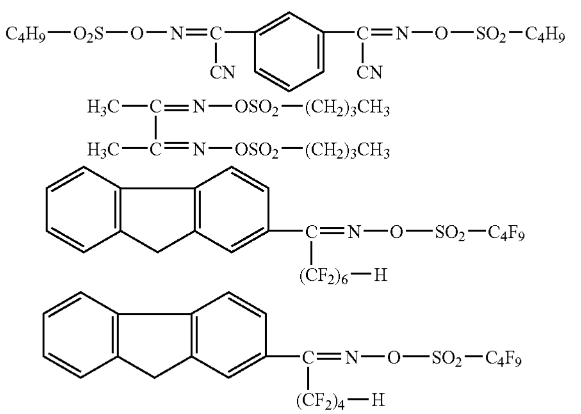

Of the aforementioned diazomethane acid generators, specific examples of suitable bisalkyl or bisaryl sulfonyl diazomethanes include bis(isopropylsulfonyl)diazomethane, bis (p-toluenesulfonyl)diazomethane, bis(1,1-dimethylethylsulfonyl)diazomethane, bis (cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis (phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis (cyclohexylsulfonyldiazomethylsulfonyl)ethane, 1,3-bis (cyclohexylsulfonyldiazomethylsulfonyl)propane, 1,6-bis (cyclohexylsulfonyldiazomethylsulfonyl)hexane, and 1,10-bis(cyclohexylsulfonyldiazomethylsulfonyl)decane, may be given.

As the component (B), one type of acid generator may be used, or two or more types of acid generators may be used in combination.

In the present invention, as the component (B), it is preferable to use an onium salt having a fluorinated alkylsulfonic acid ion as the anion moiety.

In the positive resist composition of the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

The positive resist composition of the present invention may further contain a nitrogen-containing organic compound (D) (hereafter referred to as the component (D)) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used. Examples thereof include an aliphatic amine and an aromatic amine. Among these, an aliphatic amine is preferable, and a secondary aliphatic amine or tertiary aliphatic amine is particularly desirable. The term "aliphatic cyclic group" refers to a monocyclic group or polycyclic group that has no aromaticity. An aliphatic amine is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and laurildiethanolamine. Among these, trialkylamines and/or alkylalcoholamines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo [2.2.2]octane.

Examples of other aliphatic amines include tris(2-methoxymethoxyethyl)amine, tris{2-(2-methoxyethoxy) ethyl}amine, tris{2-(2-methoxyethoxymethoxy) ethyl}amine, tris{2-(1-methoxyethoxy)ethyl}amine, tris{2-(1-ethoxyethoxy)ethyl}amine, tris{2-(1-ethoxypropoxy) ethyl}amine and tris[2-{2-(2-hydroxyethoxy)ethoxy}ethyl] amine.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline, 2,2'-dipyridyl and 4,4'-dipyridyl.

These compounds can be used either alone, or in combinations of two or more different compounds.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group.

Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone;

ketones such as acetone, methyl ethyl ketone, cyclohexanone, methyl-n-pentyl ketone, methyl isopentyl ketone, and 2-heptanone;

polyhydric alcohols, such as ethylene glycol, diethylene glycol, propylene glycol and dipropylene glycol;

compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable);

cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

<<Method of Forming a Resist Pattern>>

The method of forming a resist pattern according to the present invention includes: applying a positive resist composition of the present invention to a substrate to form a resist film on the substrate; conducting exposure of the resist film; and developing the resist film to form a resist pattern.

More specifically, the method for forming a resist pattern according to the present invention can be performed, for example, as follows.

More specifically, the method for forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed with an ArF exposure apparatus, an electron beam exposure apparatus, an EUV exposure apparatus or the like through a mask pattern or directly irradiated with electron beam without a mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing.

In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

By the positive resist composition of the present invention, a resist film can be formed on a support such as a substrate with excellent adhesion. Further, by the positive resist composition of the present invention, various lithography properties are improved, such as the shape of the resist pattern formed (e.g., circularity of the holes of a hole pattern), in-plane uniformity of the pattern dimensions (CDU), line width roughness (LWR), mask reproducibility (e.g., mask error factor (MEF)) and the like. LWR refers to the phenomenon in which the line widths of a line pattern formed using a resist composition becomes heterogeneous, and improvement in this characteristic becomes more important as the pattern becomes finer. The MEF is a parameter that indicates how faithfully mask patterns of differing dimensions can be reproduced by using the same exposure dose with fixed pitch and changing the mask size (i.e., mask reproducibility).

In the present invention, the reasons why the above-mentioned effects can be achieved have not been elucidated yet. However, one of the reasons is presumed that by virtue of the structural unit (a0) having a cyclic group containing $—SO_2—$ (which is a polar group) on the terminal of a relatively long side chain, the component (B) can be uniformly distributed, thereby resulting in the improvement in lithography properties.

Further, the positive resist composition of the present invention exhibits an excellent heat resistance.

When the amount of the structural unit (a3) within the component (A1) is less than the predetermined amount, a resist film formed using the positive resist composition exhibits a poor heat resistance, and the baking conditions during the formation of a pattern is limited. More specifically, when the heat resistance is poor, the baking temperature cannot be satisfactorily raised to obtain the desired lithography properties, and fluctuation in the dimension of the formed resist pattern is likely to become a problem. For example, when the resist becomes soft during the post-bake, the resist flows toward the direction of the gap, thereby causing fluctuation of the size of the resist pattern. As a result, the size of the portion where the resist has been removed (e.g., diameter of a hole pattern or the space width of a space pattern) becomes small. It is presumed that such a poor heat resistance is due to the fact that the structural unit (a0) has a relatively long side chain.

In the present invention, by using the structural unit (a0) in combination with the structural unit (a3) in a specific amount, it is presumed that an interaction occurs, which results in the improvement of the heat resistance.

EXAMPLES

As follows is a description of examples of the present invention, although the scope of the present invention is by no way limited by these examples.

In the following examples, a unit represented by a chemical formula (01) is designated as "compound (01)", and the same applies for compounds represented by other formulas.

The polymeric compounds 1 to 25 used as the base component in the present examples were synthesized in accordance with the following Polymer Synthesis Examples 2, 3, 1 and 4 to 25, respectively.

The compounds (B)-1 and (B)-2 used as the acid-generator component in the present examples were synthesized in accordance with the following Acid-generator Synthesis Examples 1 and 2.

The monomers used in the following polymer synthesis examples are shown below. Among these, compounds (01), (02) and (13) were synthesized in accordance with the following Monomer Synthesis Examples 1 to 3.

[Chemical Formula 57]
(01)
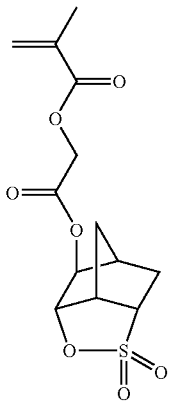
(02)
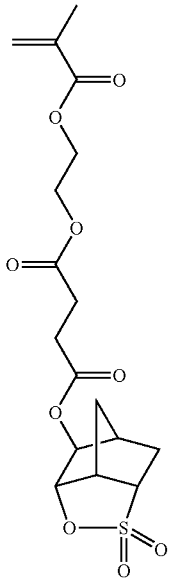
(11)
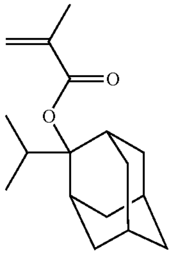
(12)
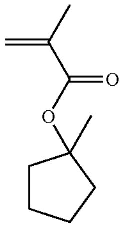
-continued
(13)
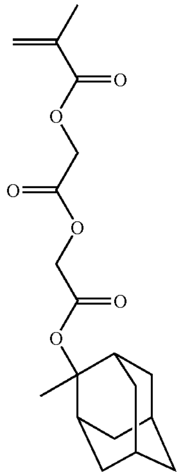
[Chemical Formula 58]
(14)
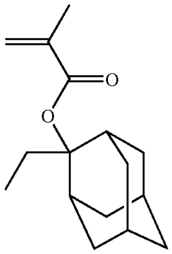
(15)
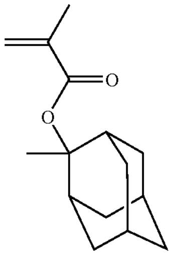
(31)
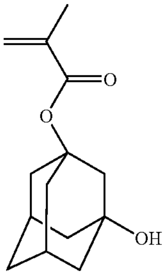
(32)
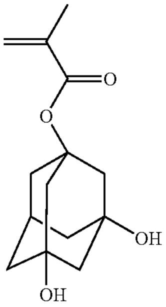

-continued

[Chemical Formula 59]

(21)

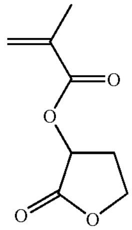

(22)

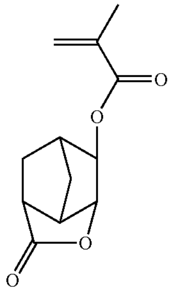

(23)

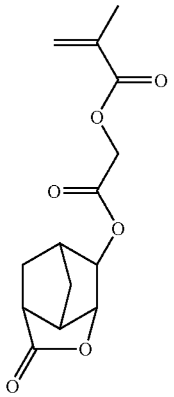

(24)

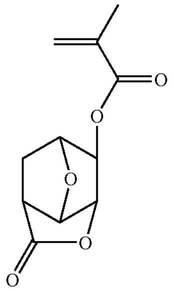

-continued (25)

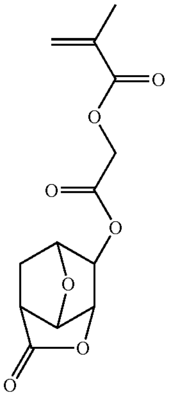

Monomer Synthesis Example 1

Synthesis of Compound (01)

The compound (01) used in the polymer synthesis examples described later was synthesized as follows.

300 ml of a THF solution containing 20 g (105.14 mmol) of an alcohol (1), 30.23 g (157.71 mmol) of ethyldiisopropylaminocarbodiimide (EDCI) hydrochloride and 0.6 g (5 mmol) of dimethylaminopyridine (DMAP) was added to a 500 ml three-necked flask in a nitrogen atmosphere, and 16.67 g (115.66 mmol) of a precursor (1) was added thereto while cooling with ice (0° C.), followed by stirring at room temperature for 12 hours.

After conducting thin-layer chromatography (TLC) to confirm that the raw materials had been consumed, 50 ml of water was added to stop the reaction. Then, the reaction solvent was concentrated under reduced pressure, and extraction was conducted with ethyl acetate three times. The obtained organic phase was washed with water, saturated sodium hydrogencarbonate and 1N-HClaq in this order. Thereafter, the solvent was distilled off under reduced pressure, and the resulting product was dried, thereby obtaining the compound (01).

[Chemical Formula 60]

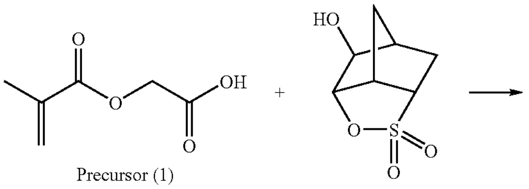

Precursor (1)

Alcohol (1)

-continued

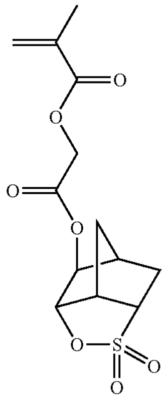

Compound (01)

The results of instrumental analysis of the obtained compound (01) were as follows. From the results, it was confirmed that the compound (01) had a structure shown below.

$^{1}$H-NMR ($CDCl_3$, 400 MHz): δ(ppm)=6.22(s, 1H,$H^{a}$), 5.70(s, 1H,$H^{b}$), 4.71-4.85(m, 2H,$H^{c,d}$), 4.67(s, 2H,$H^{k}$), 3.40-3.60(m, 2H,$H^{e,f}$), 2.58-2.70(m, 1H,$H^{g}$), 2.11-2.21(m, 2H,$H^{h}$), 2.00(s, 3H,$H^{i}$), 1.76-2.09(m, 2H,$H^{j}$).

[Chemical Formula 61]

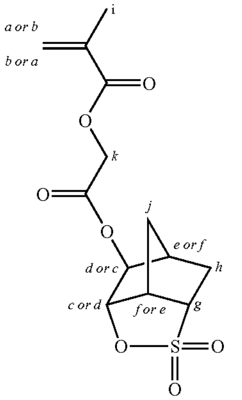

Monomer Synthesis Example 2

Synthesis of Compound (02)

In a three-necked flask in a nitrogen atmosphere, 50 g of a precursor (2) and 37.18 g of an alcohol (1) were dissolved in 500 ml of tetrahydrofuran. Then, 56.07 g of ethyldiisopropylaminocarbodiimide hydrochloride (EDCI.HCl) was added thereto, and cooled to 0° C. Then, dimethylaminopyridine (DMAP) was added thereto, and reacted for 10 minutes. Thereafter, a reaction was performed for at room temperature for 12 hours. After the completion of the reaction, 100 ml of water was added, and the resultant was concentrated under reduced pressure. Then, extraction was conducted using ethyl acetate, and the organic phase was washed with water. Subsequently, the organic phase obtained by extraction with ethyl acetate was washed with an aqueous sodium hydrogencarbonate solution three times. Next, the organic phase was washed with water. Then, the organic phase was washed with aqueous hydrochloric acid solution twice. Then, the organic phase was washed with water three times.

Finally, the resultant was concentrated under reduced pressure, followed by washing with heptane twice and drying, thereby obtaining 58.10 g of a compound (02) as an objective compound.

[Chemical Formula 62]

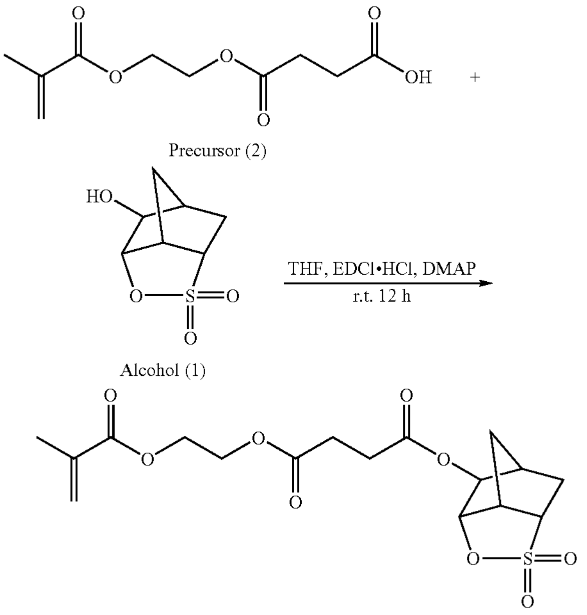

Precursor (2)

Alcohol (1)

Compound (02)

The results of instrumental analysis of the obtained compound (02) were as follows. From the results, it was confirmed that the compound (02) had a structure shown below.

$^{1}$H-NMR ($CDCl_3$, 400 MHz): δ(ppm)=6.12(s, 1H,$H^{a}$), 5.60(s, 1H,$H^{b}$), 4.73-4.71(m, 2H,$H^{c}$), 4.34(s, 4H,$H^{d}$), 3.55 (m, 1H,$H^{e}$), 3.48(m, 1H,$H^{f}$), 2.68-2.57(m, 4H,$H^{g}$), 2.16-1.76 (m, 5H,$H^{h}$), 1.93(s, 3H,$H^{i}$).

[Chemical Formula 63]

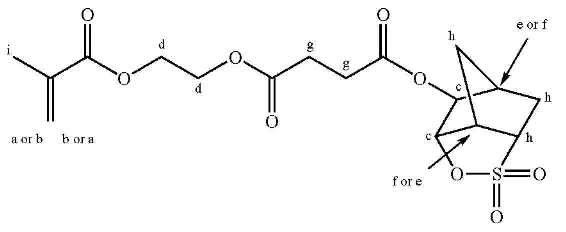

Monomer Synthesis Example 3

Synthesis of Compound (13)

165 g (584 mmol) of 2-(2-(2-methyl-2-adamantyloxy)-2-oxoethoxy)-2-oxoethanol, 2,000 ml of THF, 105 ml (754 mmol) of triethylamine, and 0.165 g (1,000 ppm) of p-methoxyphenol were added to and dissolved in a 2 L three-neck flask equipped with a thermometer, a cooling pipe, and a stirrer. Then, 62.7 ml (648 mmol) of methacryloyl chloride was gradually added thereto while cooling in an ice bath. The temperature of the resultant was elevated to room temperature, and the resultant was stirred for 3 hours. Subsequently, 1,000 ml of diethylether was added thereto, followed by washing with 200 ml of distilled water 5 times. Thereafter, the extraction liquid was concentrated, thereby obtaining 198 g of an objective compound (13) in the form of a colorless liquid (yield: 97%, GC purity: 99%).

The results of instrumental analysis of the obtained compound (13) were as follows.

$^1$H-NMR ($CDCl_3$, 400 MHz): δ(ppm)=1.58(d, J=12.5 Hz, 2H), 1.63(s, 3H), 1.71-1.89(m, 8H), 1.98(s, 3H), 2.00(m, 2H), 2.30(m, 2H), 4.62(s, 2H), 4.80(s, 2H), 5.66(m, 1H), 6.23(m, 1H).

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20.

GC-MS: 350 (M+, 1.4%), 206 (0.13%), 149 (47%), 148 (100%), 133 (20%), 69 (37%).

From the results shown above, it was confirmed that the obtained compound (13) was 2-(2-(2-methyl-2-adamantyloxy)-2-oxoethoxy)-2-oxoethyl methacrylate.

2-(2-(2-methyl-2-adamantyloxy)-2-oxoethoxy)-2-oxoethanol used above was synthesized as follows.

37.6 g (494 mmol) of glycolic acid, 700 mL of DMF, 86.5 g (626 mmol) of potassium carbonate, and 28.3 g (170 mmol) of potassium iodide were added to a 2 L three-necked flask equipped with a thermometer, a cooling pipe, and a stirrer, followed by stirring at room temperature for 30 minutes. Then, 300 ml of a dimethylformamide solution containing 100 g (412 mmol) of 2-methyl-2-adamantyl chloroacetate was gradually added thereto. The resultant was heated to 40° C., and stirred for 4 hours. Subsequently, 2,000 ml of diethylether was added to the reaction mixture, followed by filtration. The resulting solution was washed with 500 ml of distilled water three times. Then, crystallization was conducted using a mixed solvent containing 300 ml of toluene and 200 ml of heptane, thereby obtaining 78 g of a product in the form of a colorless solid (yield: 67%, GC purity: 99%).

The results of instrumental analysis of the obtained product were as follows.

$^1$H-NMR ($CDCl_3$, 400 MHz): δ(ppm)=1.59(d, 2H, J=12.5 Hz), 1.64(s, 3H), 1.71-1.99(m, 10H), 2.29(m, 2H), 2.63(t, 1H, J=5.2 Hz), 4.29(d, 2H, J=5.2 Hz), 4.67(s, 2H).

$^{13}$C-NMR: 22.35, 26.56, 27.26, 32.97, 34.54, 36.29, 38.05, 60.54, 61.50, 89.87, 165.97, 172.81.

GC-MS: 282 (M+, 0.02%), 165 (0.09%), 149 (40%), 148 (100%), 133 (22%), 117 (2.57%), 89 (0.40%).

From the results above, it was confirmed that the obtained product was 2-(2-(2-methyl-2-adamantyloxy)-2-oxoethoxy)-2-oxoethanol.

Polymer Synthesis Example 1

Synthesis of Polymeric Compound 3

In a three-necked flask equipped with a thermometer and a reflux tube, 11.77 g (69.23 mmol) of a compound (21), 15.00 g (47.47 mmol) of a compound (01), 16.58 g (63.29 mmol) of a compound (11), 4.65 g (27.69 mmol) of a compound (12) and 3.27 g (13.85 mmol) of a compound (31) were dissolved in 76.91 g of methyl ethyl ketone (MEK) to obtain a solution. Then, 22.1 mmol of dimethyl 2,2'-azobis(isobutyrate) (V-601) was added and dissolved in the obtained solution. The resultant was dropwise added to 42.72 g of MEK heated to 78° C. in a nitrogen atmosphere over 3 hours. Thereafter, the reaction solution was heated for 4 hour while stirring, and then cooled to room temperature. The obtained reaction polymer solution was dropwise added to an excess amount of n-heptane, and an operation to deposit a polymer was conducted. Thereafter, the precipitated white powder was separated by filtration, followed by washing with an n-heptane/isopropylalcohol mixed solvent and drying, thereby obtaining 41 g of a polymeric compound 3 as an objective compound.

With respect to the polymeric compound 3, the weight average molecular weight (Mw) and the dispersity (Mw/Mn) were determined by the polystyrene equivalent value as measured by gel permeation chromatography (GPC). As a result, it was found that the weight average molecular weight was 7,200, and the dispersity was 1.62. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n/o/p=36/26/17/14/8.

[Chemical Formula 64]

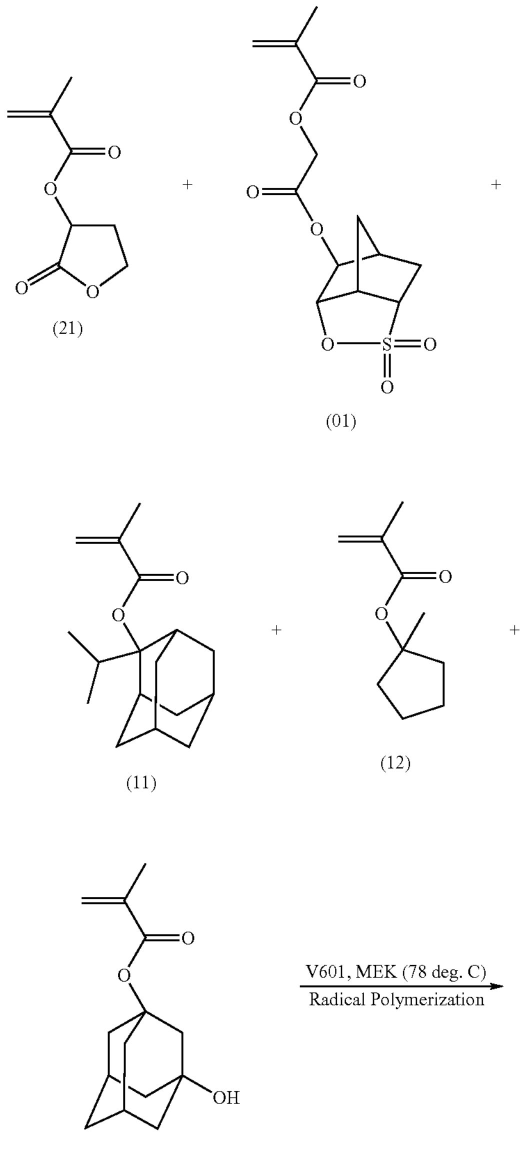

(21) + (01) + (11) + (12) + (31)

-continued

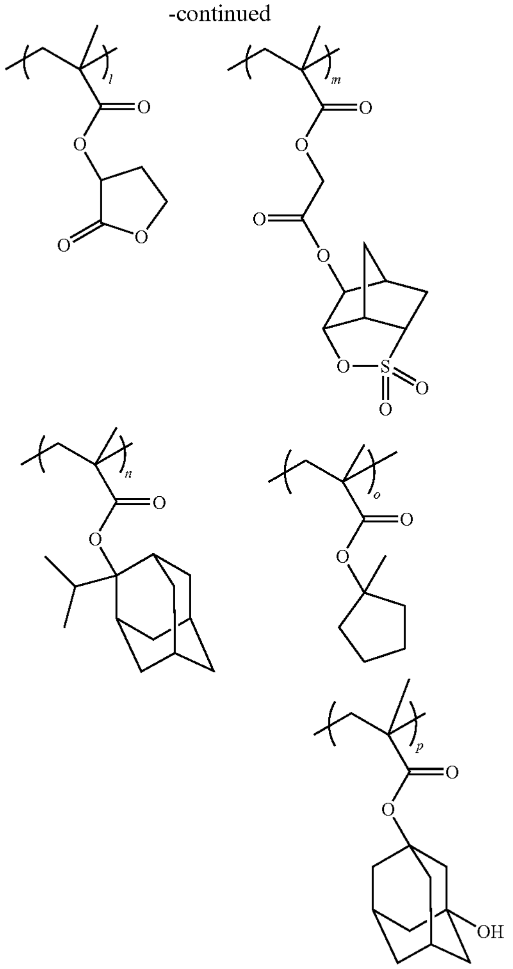

Polymeric compound 3

Polymer Synthesis Examples 2 to 4

Synthesis of Polymeric Compounds 1, 2 and 4

Polymeric compounds 1 and 2 were synthesized in the same manner as in Synthesis Example 1, except that the charge ratio of the monomers were changed.

Further, polymeric compound 4 was synthesized in the same manner as in Synthesis Example 1, except that the monomer (31) was not used.

The compositional ratios of polymeric compounds 1 to 4 (the molar ratio of the respective structural units indicated in the structural formula shown below as determined by carbon 13 nuclear magnetic resonance spectroscopy (600 MHz $^{13}C$-NMR) were as follows.

Polymeric compound 1: l/m/n/o/p=30/19/18/13/19, molecular weight=7,300, dispersity=1.47

Polymeric compound 2: l/m/n/o/p=37/22/15/14/12, molecular weight=7,300, dispersity=1.39

Polymeric compound 3: l/m/n/o/p=36/26/17/14/8, molecular weight=7,200, dispersity=1.62

Polymeric compound 4: l/m/n/o/p=36/34/17/13/0, molecular weight=7,100, dispersity=1.74

[Chemical Formula 65]

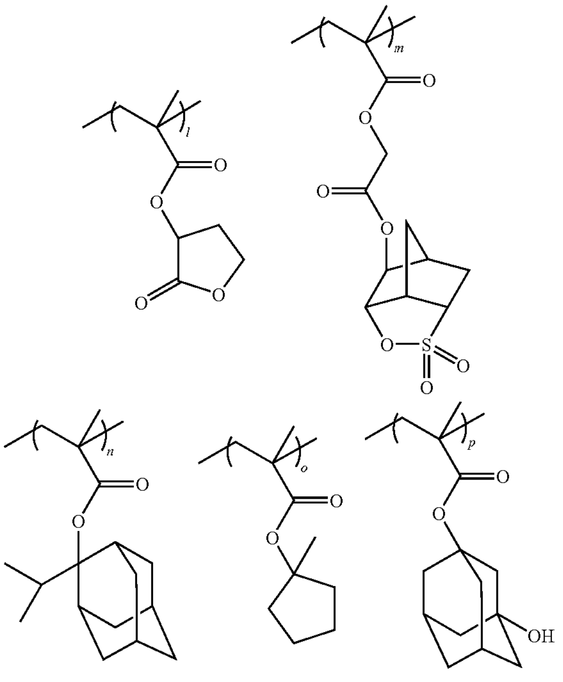

Polymer Synthesis Example 5

Synthesis of Polymeric Compound 5

In a three-necked flask equipped with a thermometer and a reflux tube, 25.00 g (79.1 mmol) of a compound (01), 9.69 g (27.7 mmol) of a compound (13) and 6.62 g (26.3 mmol) of a compound (32) were dissolved in 95.70 g of methyl ethyl ketone (MEK) to obtain a solution. Then, 14.4 mmol of dimethyl 2,2'-azobis(isobutyrate) (V-601) was added and dissolved in the obtained solution. The resultant was dropwise added to 59.36 g of MEK (which had 59.36 g (266.6 mmol) of a compound (II) dissolved therein) heated to 80° C. in a nitrogen atmosphere over 3 hours. Thereafter, the reaction solution was heated for 2 hour while stirring, and then cooled to room temperature.

The obtained reaction polymer solution was dropwise added to an excess amount of n-heptane, and an operation to deposit a polymer was conducted. Thereafter, the precipitated white powder was separated by filtration, followed by washing with an n-heptane/2-propanol mixed solvent and methanol in this order. The resultant was dried, thereby obtaining 44 g of a polymeric compound 5 as an objective compound.

With respect to the obtained polymeric compound, the weight average molecular weight (Mw) and the dispersity (Mw/Mn) were determined by the polystyrene equivalent value as measured by gel permeation chromatography (GPC). As a result, it was found that the weight average molecular weight was 8,300, and the dispersity was 1.68. Further, the compositional ratio (the molar ratio of the respective structural units indicated in the structural formula shown below) as determined by carbon 13 nuclear magnetic resonance spectroscopy (600 MHz, $^{13}C$-NMR) was l/m/n/o=33.0/10.9/44.4/11.7.

[Chemical Formula 66]

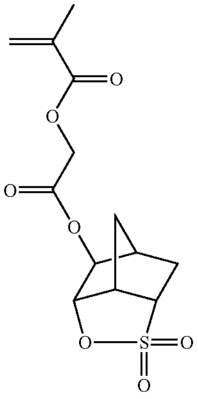

(01)

+

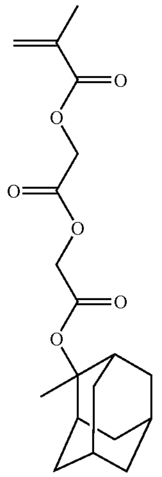

(13)

+

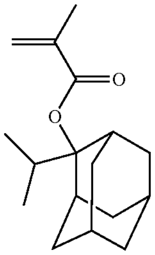

(11)

+

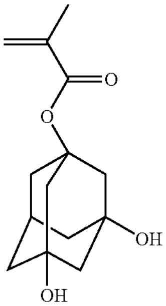

(32)

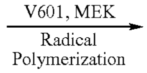

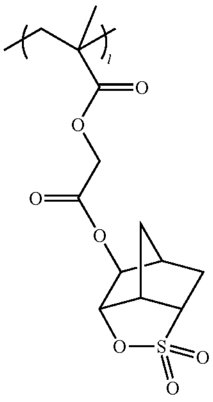

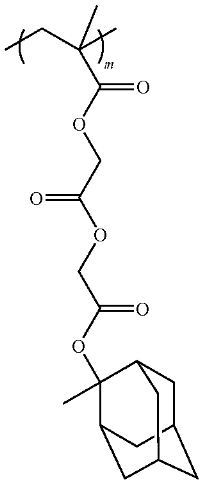

-continued

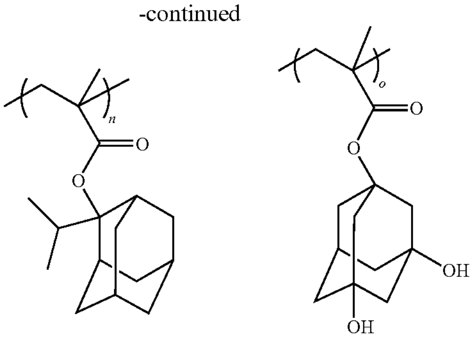

Polymeric compound 5

Polymer Synthesis Examples 6 to 25

Synthesis of Polymeric Compounds 6 to 25

Polymeric compounds 6 to 25 were synthesized in the same manner as in Synthesis Example 5, except that the charge ratio of the monomers were changed.

The monomers used in the synthesis of polymeric compounds 5 to 25 are shown in Tables 1 to 4. Further, with respect to each of the obtained polymeric compounds 5 to 25, the compositional ratio (the molar ratio of the respective structural units indicated in the structural formula shown below) as determined by carbon 13 nuclear magnetic resonance spectroscopy (600 MHz, $^{13}$C-NMR), and the Mw and Mw/Mn determined by the polystyrene equivalent value as measured by GPC are shown in Tables 1 to 4.

TABLE 1

| | | Polymeric compound | | | | | |
|---|---|---|---|---|---|---|---|
| | | 5 | 6 | 7 | 8 | 9 | 10 |
| Mono- | (21) | | | 35.0 | | | |
| mer | (01) | 33.0 | 31.9 | 26.5 | 39.5 | 39.3 | 38.3 |
| | (11) | 44.4 | 25.8 | 17.9 | | | |
| | (12) | | | 13.2 | | 41.1 | 40.0 |
| | (13) | 10.9 | 10.3 | | | | |
| | (14) | | 21.6 | | | | |
| | (15) | | | | 41.4 | | |
| | (32) | 11.7 | 10.4 | 7.4 | 19.1 | 19.6 | 21.7 |
| Mw | | 8300 | 8200 | 7900 | 9200 | 9300 | 8100 |
| Mw/Mn | | 1.68 | 1.74 | 1.78 | 1.52 | 1.51 | 1.58 |

TABLE 2

| | | Polymeric compound | | | | | |
|---|---|---|---|---|---|---|---|
| | | 11 | 12 | 13 | 14 | 15 | 16 |
| Mono- | (21) | 33.2 | | | | | 33.0 |
| mer | (22) | | 35.2 | | | | |
| | (23) | | | 35.2 | | | |
| | (24) | | | | | 35.5 | |
| | (25) | | | | 35.5 | | |
| | (01) | 25.1 | 26.6 | 26.5 | 26.4 | 26.4 | 25.3 |
| | (11) | 31.6 | 18.1 | 18.1 | 18.0 | 18.0 | |
| | (12) | | 13.5 | 13.6 | 13.7 | 13.7 | 32.1 |
| | (32) | 10.1 | 5.6 | 6.6 | 6.4 | 6.4 | 9.6 |
| Mw | | 7700 | 7600 | 7600 | 7800 | 7800 | 7800 |
| Mw/Mn | | 1.69 | 1.70 | 1.66 | 1.69 | 1.69 | 1.65 |

TABLE 3

| | | Polymeric compound | | | | | | |
|---|---|---|---|---|---|---|---|---|
| | | 17 | 18 | 19 | 20 | 21 | 22 | 23 |
| Mono-mer | (21) | 39.2 | 26.8 | 28.4 | | | | |
| | (01) | | 20.0 | 20.9 | | 34.4 | 35.1 | 15.2 |
| | (02) | 21.3 | | | 30.2 | | | 17.8 |
| | (11) | 19.8 | 22.1 | 18.9 | 43.7 | | 23.1 | 45.7 |
| | (12) | | | 18.0 | | | | |
| | (13) | 12.1 | 11.5 | 5.3 | 6.3 | 11.3 | 8.9 | 10.9 |
| | (14) | | | | | 40.7 | 23.2 | |
| | (32) | 7.6 | 19.6 | 8.5 | 19.8 | 13.6 | 9.7 | 10.4 |
| Mw | | 7800 | 6200 | 7000 | 6700 | 7700 | 7400 | 7800 |
| Mw/Mn | | 1.66 | 1.60 | 1.57 | 1.50 | 1.54 | 1.68 | 1.67 |

TABLE 4

| | | Polymeric compound | |
|---|---|---|---|
| | | 24 | 25 |
| Monomer | (01) | 30 | 35 |
| | (13) | 10 | 10 |
| | (11) | 50 | 23 |
| | (14) | | 22 |
| | (31) | 10 | 10 |
| Mw | | 10000 | 8000 |
| Mw/Mn | | 1.8 | 1.7 |

Acid Generator Synthesis Example 1

Synthesis of Compound (B)-1

5.87 g of 3,5-dimethyl-4-(2-methyl-2-adamantyloxycarbonylmethyleneoxy)phenyldiphenylsulfonium bromide, 41.85 g of dichloromethane and 20.93 g of pure water were added to a beaker, and 4.16 g of sodium 2-(1'-adamantane)carbonyloxy-1,1-difluoroethanesulfonate, followed by stirring at room temperature for 1 hour. Then, the reaction mixture was subjected to liquid separation, and the organic phase was washed with a diluted hydrochloric acid and water in this order. The obtained organic phase was dropwise added to 249.0 g of n-hexane, thereby obtaining 6.70 g of compound (B)-1 as an objective compound in the form of a white powder.

[Chemical Formula 67]

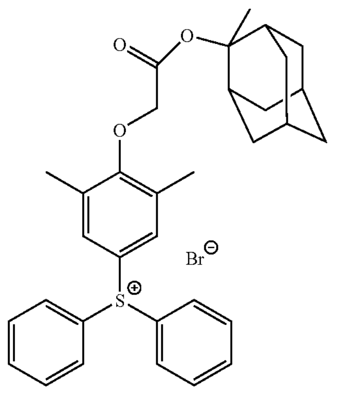

+

-continued

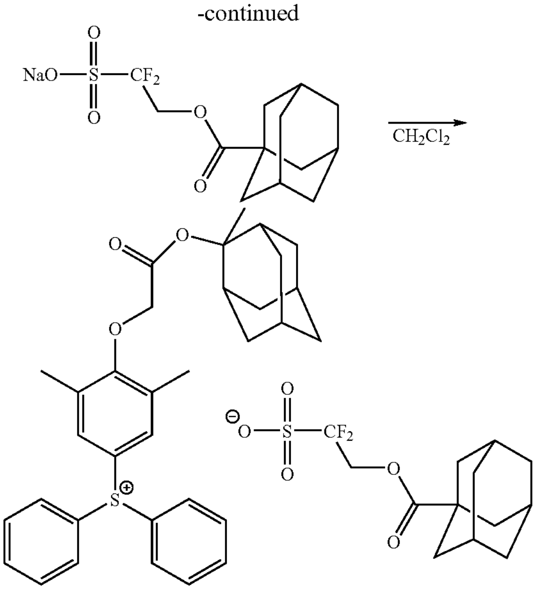

(B)-1

Acid Generator Synthesis Example 2

Synthesis of Compound (B)-2

8.2 g of a precursor (3) and 82 g of dichloromethane were added to a three-necked flask in a nitrogen atmosphere, and cooled to 5° C. or lower. Then, 0.46 g of N,N-dimethylaminopyridine (DMAP) was added thereto, stirring was conducted at a temperature of 5° C. or lower for 5 minutes, and 3.9 g of ethyl-N,N-dimethylaminopropylcarbodiimide was added thereto. Thereafter, stirring was conducted for 10 minutes, and 4.3 g of 1-ethyl-1-cyclopentanol was added thereto. Then, the temperature of the resultant was elevated to room temperature, and stirring was conducted at room temperature for 15 hours, followed by washing with a diluted hydrochloric acid and pure water in this order. The resulting organic phase was dropwise added to 1,000 g of n-hexane and precipitated, thereby obtaining 5.0 g of a precursor (4).

Subsequently, the obtained precursor (4) was subjected to a salt exchange reaction with a compound (4) which was synthesized in accordance with the description in paragraph [0487] of US Pre-Grant Publication No. 2009-0130597, thereby obtaining a compound (B)-2.

[Chemical Formula 68]

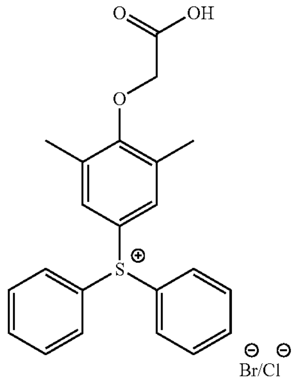

+

Precursor (3)

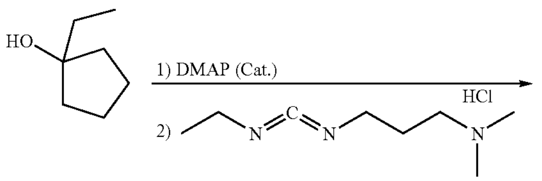

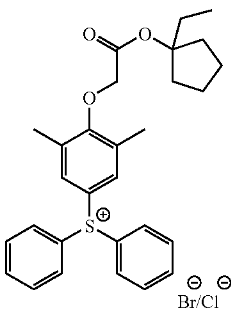

Precursor (4)

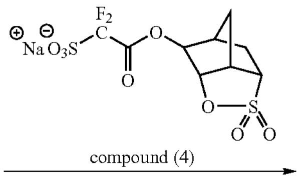

-continued

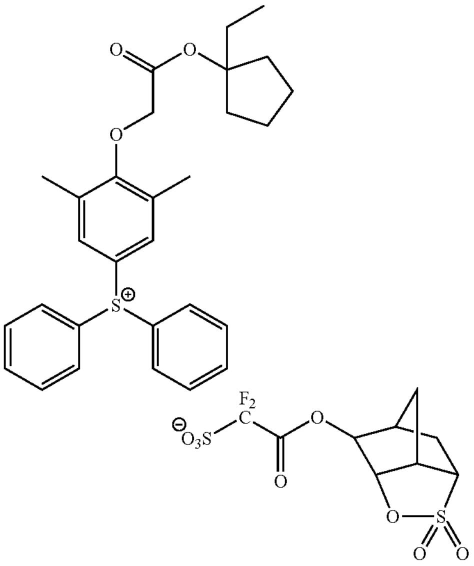

(B)-2

Production of Positive Resist Composition

Test Examples 1 to 12

The components shown in Table 5 were mixed together and dissolved to obtain positive resist compositions. With respect to Test Examples 1 to 12, Test Examples 1 to 3 and 5 to 12 are examples of the present invention, and Test Example 4 is a comparative example.

TABLE 5

| | Component (A) | | Component (B) | Component (D) | Component (S) | |
|---|---|---|---|---|---|---|
| Test Example 1 | (A)-1 [100] | | (B)-1 [9.8] | (D)-1 [0.5] | (S)-1 [2000] | (S)-2 [10] |
| Test Example 2 | (A)-2 [100] | | (B)-1 [9-8] | (D)-1 [0.5] | (S)-1 [2000] | (S)-2 [10] |
| Test Example 3 | (A)-3 [100] | | (B)-1 [9.8] | (D)-1 [0.5] | (S)-1 [2000] | (S)-2 [10] |
| Test Example 4 | (A)-4 [100] | | (B)-1 [9.8] | (D)-1 [0.5] | (S)-1 [2000] | (S)-2 [10] |
| Test Example 5 | (A)-5 [100] | | (B)-1 [9.8] | (D)-1 [0.5] | (S)-1 [2000] | (S)-2 [10] |
| Test Example 6 | (A)-5 [100] | | (B)-2 [10.5] | (D)-1 [0.21] | (S)-1 [2400] | (S)-2 [10] |
| Test Example 7 | (A)-6 [100] | | (B)-2 [10.5] | (D)-1 [0.21] | (S)-1 [2400] | (S)-2 [10] |
| Test Example 8 | (A)-7 [100] | | (B)-2 [10.5] | (D)-1 [0.21] | (S)-1 [2400] | (S)-2 [10] |
| Test Example 9 | (A)-8 [100] | | (B)-2 [10.5] | (D)-1 [0.21] | (S)-1 [2400] | (S)-2 [10] |
| Test Example 10 | (A)-9 [100] | | (B)-2 [10.5] | (D)-1 [0.21] | (S)-1 [2400] | (S)-2 [10] |
| Test Example 11 | (A)-6 [50] | (A)-7 [50] | (B)-2 [10.5] | (D)-1 [0.21] | (S)-1 [2400] | (S)-2 [10] |
| Test Example 12 | (A)-8 [50] | (A)-9 [50] | (B)-2 [10.5] | (D)-1 [0.21] | (S)-1 [2400] | (S)-2 [10] |

In Table 5, the reference characters indicate the following. Further, the values in brackets [ ] indicate the amount (in terms of parts by weight) of the component added.

(A)-1: the aforementioned polymeric compound 1 (amount of structural unit (a3): 19 mol %)

(A)-2: the aforementioned polymeric compound 2 (amount of structural unit (a3): 12 mol %)

(A)-3: the aforementioned polymeric compound 3 (amount of structural unit (a3): 8 mol %)

(A)-4: the aforementioned polymeric compound 4 (amount of structural unit (a3): 0 mol %)

(A)-5: the aforementioned polymeric compound 7 (amount of structural unit (a3): 7.8 mol %)

(A)-6: the aforementioned polymeric compound 5 (amount of structural unit (a3): 10 mol %)

(A)-7: the aforementioned polymeric compound 6 (amount of structural unit (a3): 10.4 mol %)

(A)-8: the aforementioned polymeric compound 24 (amount of structural unit (a3): 10 mol %)

(A)-9: the aforementioned polymeric compound 25 (amount of structural unit (a3): 10 mol %)

(B)-1: the aforementioned compound (B)-1

(B)-2: the aforementioned compound (B)-2

(D)-1: tri-n-pentylamine (S)-1: a mixed solvent of PGMEA/PGME=6/4 (weight ratio)

(S)-2: γ-butyrolactone

Using the obtained positive resist compositions, the heat resistance was evaluated as follows.

<Evaluation of Heat Resistance 1: Trench Pattern>

Each of the positive resist compositions of Test Examples 1 to 5 was applied to an 8-inch silicon substrate which had been treated (90° C. for 36 seconds) with hexamethyldisilazane (HMDS), and prebaked (post applied bake (PAB)) on a hot plate at 90° C. for 60 seconds and dried, thereby forming a resist film having a film thickness of 200 nm. Subsequently, the resist film was selectively irradiated with an ArF excimer laser (193 nm) through a mask pattern, using an ArF exposure apparatus NSR-5302 (manufactured by Nikon Corporation, NA (numerical aperture)=0.60, σ=0.75). Thereafter, a post exposure bake (PEB) treatment was conducted at 85° C. for 60 seconds, followed by development for 30 seconds at 23° C. in a 2.38% by weight aqueous solution of tetramethylammonium hydroxide (TMAH). Then, the resist was washed for 15 seconds with pure water. As a result, a trench pattern having a space width of 300 nm was formed on each of the resist films.

The thus formed trench pattern was subjected to a post bake treatment at a predetermined temperature (140° C., 160° C. or 180° C.) for 60 seconds. Then, each trench pattern after the post bake treatment was observed from the upper side thereof using a scanning electron microscope, and the space width (nm) was measured.

As a result, in Test Examples 1 to 3 and 5, almost no influence was noted after the post bake treatment at 140° C. In Test Example 4, the space width became slightly small.

After the post bake treatment at 160° C., almost no influence was noted in Test Examples 1 and 2, and the space width became slightly small in Test Example 3. In Test Example 4, the pattern was completely filled.

After the post bake treatment at 180° C., the space width became small in all of Test Examples 1 to 5. However, the change in size was smaller as the amount of the structural unit (a3) became larger. The space width of each example after the post bake treatment at 180° C. are shown in Table 6.

TABLE 6

| | Space width of trench pattern | |
|---|---|---|
| | Prior to post bake | After post bake (180° C.) |
| Test Example 1 | 300 nm | 289 nm |
| Test Example 2 | 300 nm | 244 nm |
| Test Example 3 | 300 nm | 197 nm |
| Test Example 4 | 300 nm | 0 nm |
| Test Example 5 | 300 nm | 159 nm |

<Evaluation of Heat Resistance 2: Hole Pattern>

Isolated patterns having a hole diameter of 300 nm were formed in the same manner as in the "evaluation of heat resistance 1", except that the mask pattern was changed.

The thus formed hole patterns were subjected to a post bake treatment at a predetermined temperature (100° C. to 170° C., at intervals of 10° C.) for 60 seconds. Then, each hole pattern after the post bake treatment was observed from the upper side thereof using a scanning electron microscope, and the size (diameter) (nm) of the hole pattern was measured.

As a result, in Test Examples 1 to 5, almost no influence was noted after the post bake treatment at 100 to 140° C.

After the post bake treatment at 150 to 160° C., almost no influence was noted in Test Examples 1 and 2, and the size of the hole pattern became slightly small in Test Examples 3 and 5. In Test Example 4, the size of the hole pattern became smaller than those of Test Examples 1 to 3 and 5.

After the post bake treatment at 170° C., the size of the hole pattern became small in all of Test Examples 1 to 5. However, the change in size was smaller as the amount of the structural unit (a3) became larger. The size of the hole pattern for each example after the post bake treatment at 170° C. are shown in Table 7.

TABLE 7

| | Size of hole pattern | |
|---|---|---|
| | Prior to post bake | After post bake (170° C.) |
| Test Example 1 | 300 nm | 292 nm |
| Test Example 2 | 300 nm | 261 nm |
| Test Example 3 | 300 nm | 205 nm |
| Test Example 4 | 300 nm | 0 nm |
| Test Example 5 | 300 nm | 185 nm |

From the results shown above, it was confirmed that the larger the amount of the structural unit (a3) within the component (A1), the higher the heat resistance of a positive resist composition containing the polymeric compound, and change in size of the resist pattern caused by a baking treatment was less likely to occur.

<Evaluation of Lithography Properties 1>

Using the resist compositions obtained in Test Examples 1 to 4, resist patterns were formed in the following manner, and the lithography properties were evaluated.

[Formation of Resist Pattern; Contact Hole Pattern]

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm. Then, each of the resist compositions obtained above was applied to the anti-reflection film using a spinner, and was then prebaked (PAB) on a hotplate at 100° C. for 60 seconds and dried, thereby forming a resist film having a film thickness of 120 nm.

Subsequently, a coating solution for forming a protection film (product name: TILC-035; manufactured by Tokyo Ohka Kogyo Co., Ltd.) was applied to the resist film using a spinner, and then heated at 90° C. for 60 seconds, thereby forming a top coat with a film thickness of 35 nm.

Thereafter, using an ArF exposure apparatus for immersion lithography (product name: NSR-S609B, manufactured by Nikon Corporation, NA (numerical aperture)=1.07, σ0.97), the resist film having a top coat formed thereon was selectively irradiated with an ArF excimer laser (193 nm) through a mask pattern for forming a hole pattern.

Thereafter, a post exposure bake (PEB) treatment was conducted at 95° C. for 60 seconds, followed by alkali development for 30 seconds at 23° C. in a 2.38% by weight aqueous solution of tetramethylammonium hydroxide (TMAH) (product name: NMD-W; manufactured by Tokyo Ohka Kogyo Co., Ltd.). Then, the resist was washed for 25 seconds with pure water, followed by drying by shaking.

As a result, in each of the examples, a contact hole pattern in which holes having a diameter of 70 nm were equally spaced (pitch: 122.5 nm) was formed on the resist film (hereafter, this contact hole pattern is referred to as "dense CH pattern").

[Evaluation of in-Plane Uniformity]

The dense CH patterns formed above were observed using a scanning electron microscope (SEM) (product name: S-9220, manufactured by Hitachi, Ltd.). As a result, in Test Example 4, it was observed that a part of the pattern was covered, and fluctuation in the in-plane pattern size was noted. On the other hand, in Test Examples 1 to 3, such fluctuation was not noted. The reason for this is presumed that by introducing the structural unit (a3), diffusion of the acid generated from the component (B) can be appropriately suppressed, and EL margin is improved, thereby suppressing the fluctuation of the in-plane size.

<Evaluation of Lithography Properties 2>

Using the resist compositions obtained in Test Examples 6 to 12, resist patterns were formed in the following manner, and the lithography properties were evaluated.

[Formation of Resist Pattern]

An organic anti-reflection film composition (product name: ARC29, manufactured by Brewer Science Ltd.) was applied to a 12-inch silicon wafer using a spinner, and the composition was then baked at 205° C. for 60 seconds, thereby forming an organic anti-reflection film having a film thickness of 89 nm. Then, each of the resist compositions obtained above was applied to the anti-reflection film using a spinner, and was then prebaked (PAB) on a hotplate at 90° C. for 60 seconds and dried, thereby forming a resist film having a film thickness of 100 nm.

Subsequently, a coating solution for forming a protection film (product name: TILC-057; manufactured by Tokyo Ohka Kogyo Co., Ltd.) was applied to the resist film using a spinner, and then heated at 90° C. for 60 seconds, thereby forming a top coat with a film thickness of 35 nm.

Thereafter, using an ArF immersion exposure apparatus (product name: NSR-S609B, manufactured by Nikon Corporation, NA (numerical aperture)=1.07, σ0.97), the resist film having a top coat formed thereon was selectively irradiated with an ArF excimer laser (193 nm) through a mask pattern for forming a hole pattern.

Thereafter, a post exposure bake (PEB) treatment was conducted at 80° C. for 60 seconds, followed by alkali development for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist was washed for 25 seconds with pure water, followed by drying by shaking. Further, a post bake treatment was conducted at 100° C. for 45 seconds.

As a result, in each of the examples, a contact hole pattern in which holes having a diameter of 85 nm were equally spaced (pitch: 140 nm) was formed on the resist film (hereafter, this contact hole pattern is referred to as "CH pattern").

[Evaluation of Mask Reproducibility]

Using the optimum exposure dose with which the above CH pattern was formed, CH patterns were formed using a mask pattern (the pitch fixed at 140 nm) targeting a hole diameter of 81 nm to 88 nm (8 targets at intervals of 1 nm). The value of the mask error factor was determined as the gradient of a graph obtained by plotting the target size (nm) on the horizontal axis, and the actual hole diameter (nm) of the formed CH patterns on the vertical axis. The mask reproducibility was evaluated in accordance with the following criteria. The results are shown in Table 8. A MEF value (gradient of the plotted line) closer to 1 indicates that a resist pattern faithful to the mask pattern was formed.

(Criteria)

A: MEF is 4 or more and less than 4.5

B: MEF is 4.5 or more and less than 5.0

TABLE 8

| | Mask reproducibility |
|---|---|
| Test Example 6 | A |
| Test Example 7 | A |
| Test Example 8 | A |
| Test Example 9 | B |
| Test Example 10 | B |
| Test Example 11 | A |
| Test Example 12 | B |

From the results shown above, it was found that the MEF can be improved by using a specific amount of the structural unit (a3) within the component (A1).

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising a base component (A) which exhibits increased solubility in an alkali developing solution under action of acid and an acid-generator component (B) which generates acid upon exposure, the base component (A) comprising a polymeric compound (A1) comprised of a structural unit (a0) represented by general formula (a0-1) shown below, a structural unit (a1) derived from an acrylate ester containing an acid dissociable, dissolution inhibiting group, and a structural unit (a3) derived from an acrylate ester containing a hydroxy group-containing aliphatic hydrocarbon group represented by general formula (a3-1) shown below, and the amount of the structural unit (a3) based on the combined total of all structural units constituting the polymeric compound (A1) being in the range of 1 to 30 mol %:

[Chemical Formula 1]

(a0-1)

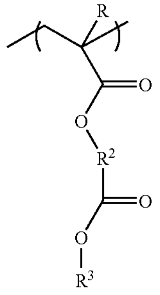

(a3-1)

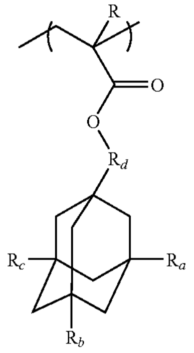

in formula (a0-1), R represents a hydrogen atom, an alkyl group of 1 to 5 carbon atoms or a halogenated alkyl group of 1 to 5 carbon atoms, $R^2$ represents a divalent linking group, and $R^3$ represents a cyclic group containing $—SO_2—$ within the ring skeleton thereof; and in formula (a3-1), R represents a hydrogen atom, an alkyl group of 1 to 5 carbon atoms or a halogenated alkyl group of 1 to 5 carbon atoms; each of Ra, Rb and Rc independently represents a hydrogen atom, an alkyl group of 1 to 5 carbon atoms, a hydroxy group or a hydroxyalkyl group, provided that at least one of Ra, Rb and Rc represents a hydroxy group or a hydroxyalkyl group; and Rd represents a single bond or a divalent linking group.

2. The positive resist composition according to claim 1, wherein $R^3$ represents a cyclic group containing $—O—SO_2—$ within the ring skeleton thereof.

3. The positive resist composition according to claim 2, wherein $R^3$ is a cyclic group represented by general formula (3-1) shown below:

[Chemical Formula 2]

(3-1)

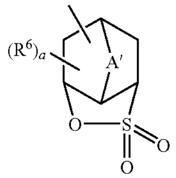

wherein A' represents an oxygen atom, a sulfur atom, or an alkylene group of 1 to 5 carbon atoms which may contain an oxygen atom or a sulfur atom; a represents an integer of 0 to 2; and $R^6$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

4. The positive resist composition according to claim 1, wherein the structural unit (a1) comprises at least two types of structural units.

5. The positive resist composition according to claim 1, wherein the structural unit (a1) comprises at least one member selected from the group consisting of a structural unit represented by general formula (a1-0-11) shown below, a structural unit represented by general formula (a1-0-12) shown below and a structural unit represented by general formula (a1-0-2) shown below:

[Chemical Formula 3]

(a1-0-11)

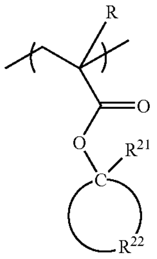

(a1-0-12)

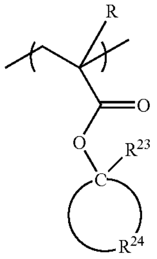

(a1-0-2)

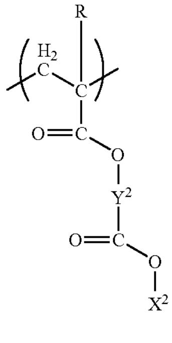

wherein R represents a hydrogen atom, an alkyl group of 1 to 5 carbon atoms or a halogenated alkyl group of 1 to 5 carbon atoms; $R^{21}$ represents an alkyl group; $R^{22}$ represents a group which forms an aliphatic monocyclic group with the carbon atom to which $R^{22}$ is bonded; $R^{23}$ represents a branched alkyl group; $R^{24}$ represents a group which forms an aliphatic polycyclic group with the carbon atom to which $R^{24}$ is bonded; $Y^2$ represents a divalent linking group; and $X^2$ represents an acid dissociable, dissolution inhibiting group.

6. The positive resist composition according to claim 1, wherein the polymeric compound (A1) further comprises a structural unit (a2) derived from an acrylate ester containing a lactone-containing cyclic group.

7. The positive resist composition according to claim 1, which further comprises a nitrogen-containing organic compound (D).

8. A method of forming a resist pattern, comprising: forming a resist film using a positive resist composition of claim 1; conducting exposure of the resist film; and alkali-developing the resist film to form a resist pattern.

* * * * *